United States Patent
Almgren et al.

(10) Patent No.: US 9,571,161 B2
(45) Date of Patent: Feb. 14, 2017

(54) CONTACTLESS COMMUNICATION UNIT CONNECTOR ASSEMBLIES

(71) Applicant: KEYSSA, INC., Campbell, CA (US)

(72) Inventors: Eric Almgren, Mountain View, CA (US); Anthony Michael Fadell, Portola Valley, CA (US); Roger D. Isaac, San Jose, CA (US); Gary D. McCormack, Tigard, OR (US); Mariel van Tatenhove, Mountain View, CA (US)

(73) Assignee: KEYSSA, INC., Campbell, CA (US)

( * ) Notice: Subject to any disclaimer, the term of this patent is extended or adjusted under 35 U.S.C. 154(b) by 0 days.

(21) Appl. No.: 14/459,021

(22) Filed: Aug. 13, 2014

(65) Prior Publication Data

US 2015/0048907 A1 Feb. 19, 2015

Related U.S. Application Data

(60) Provisional application No. 61/865,542, filed on Aug. 3, 2013.

(51) Int. Cl.
*H01P 5/02* (2006.01)
*H04B 5/00* (2006.01)
*H01P 3/00* (2006.01)

(52) U.S. Cl.
CPC .................................... *H04B 5/0031* (2013.01)

(58) Field of Classification Search
CPC ............. H01P 5/02; H01R 9/00; H01R 12/71; H01R 13/665
USPC .. 333/24 R, 248, 254; 439/39, 44; 455/41.1; 710/303; 385/14, 43, 52, 92
See application file for complete search history.

(56) References Cited

U.S. PATENT DOCUMENTS

| | | | | |
|---|---|---|---|---|
| 5,835,646 | A * | 11/1998 | Yoshimura | G02B 6/262 385/134 |
| 5,854,868 | A * | 12/1998 | Yoshimura | B82Y 20/00 385/14 |
| 6,215,585 | B1 * | 4/2001 | Yoshimura | G02B 6/43 359/344 |
| 6,334,012 | B1 * | 12/2001 | Yoon | G02B 6/4201 385/24 |
| 6,442,315 | B1 * | 8/2002 | Rhee | G02B 6/305 385/43 |
| 6,937,790 | B2 * | 8/2005 | Bridges | 385/30 |
| 7,250,920 | B1 | 7/2007 | Steinbrecher | |
| 8,288,157 | B2 * | 10/2012 | Duer | G01N 21/648 422/82.11 |
| 8,585,432 | B2 * | 11/2013 | Yagisawa | H04B 10/801 439/493 |
| 9,046,668 | B2 * | 6/2015 | Matsumoto | G02B 6/4214 |
| 2006/0062229 | A1 | 3/2006 | Lee et al. | |
| 2007/0018666 | A1 * | 1/2007 | Barabi | G01R 1/06722 324/754.14 |

(Continued)

*Primary Examiner* — Dean Takaoka
(74) *Attorney, Agent, or Firm* — Van Court & Aldridge LLP

(57) ABSTRACT

Contactless extremely high frequency connector assemblies, passive cable connector assemblies, and active cable connector assemblies are disclosed herein. In one embodiment, a contactless connector assembly can include several (EHF) contactless communication units operable to selectively transmit and receive EHF signals, and several signal directing structures coupled to the EHF CCUs. The signal directing structures can direct the EHF signals along a plurality of EHF signal pathways.

31 Claims, 25 Drawing Sheets

(56) References Cited

U.S. PATENT DOCUMENTS

| | | | |
|---|---|---|---|
| 2012/0115414 A1* | 5/2012 | Fadell | G06F 1/1632 455/39 |
| 2012/0261158 A1 | 10/2012 | Daniel et al. | |
| 2013/0157477 A1* | 6/2013 | McCormack | H01R 13/6205 439/39 |
| 2013/0183903 A1 | 7/2013 | McCormack et al. | |
| 2013/0314182 A1* | 11/2013 | Takeda | H01P 3/16 333/24 R |
| 2014/0055945 A1* | 2/2014 | Sudak | H04W 4/008 361/679.41 |
| 2014/0059264 A1* | 2/2014 | Sudak | H04W 4/008 710/303 |
| 2014/0235164 A1* | 8/2014 | Vaucher | H04B 5/0031 455/41.1 |
| 2014/0347082 A1* | 11/2014 | Jeong | G01R 1/06772 324/750.27 |
| 2015/0126047 A1* | 5/2015 | McCormack | H01R 13/6205 439/39 |

\* cited by examiner

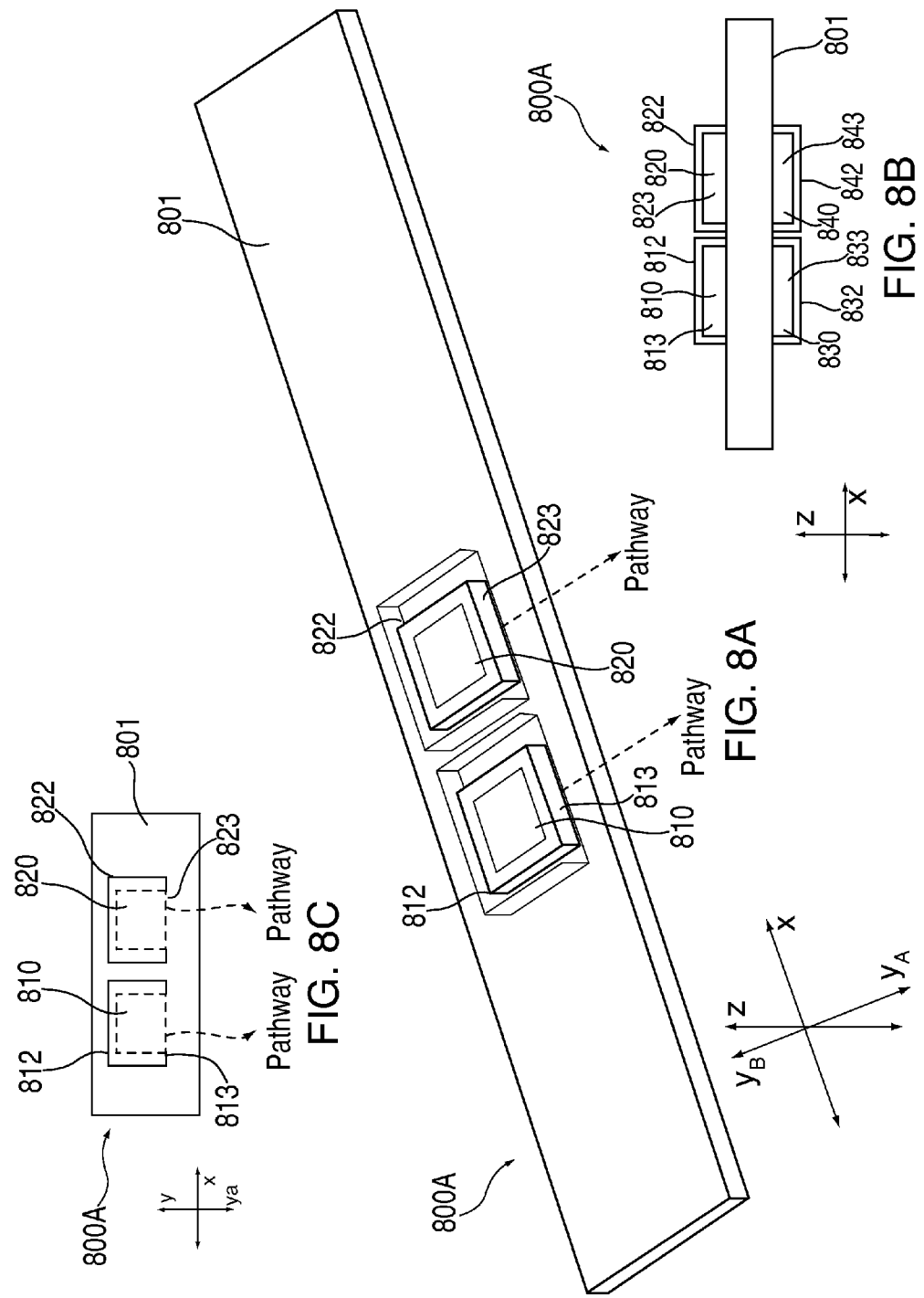

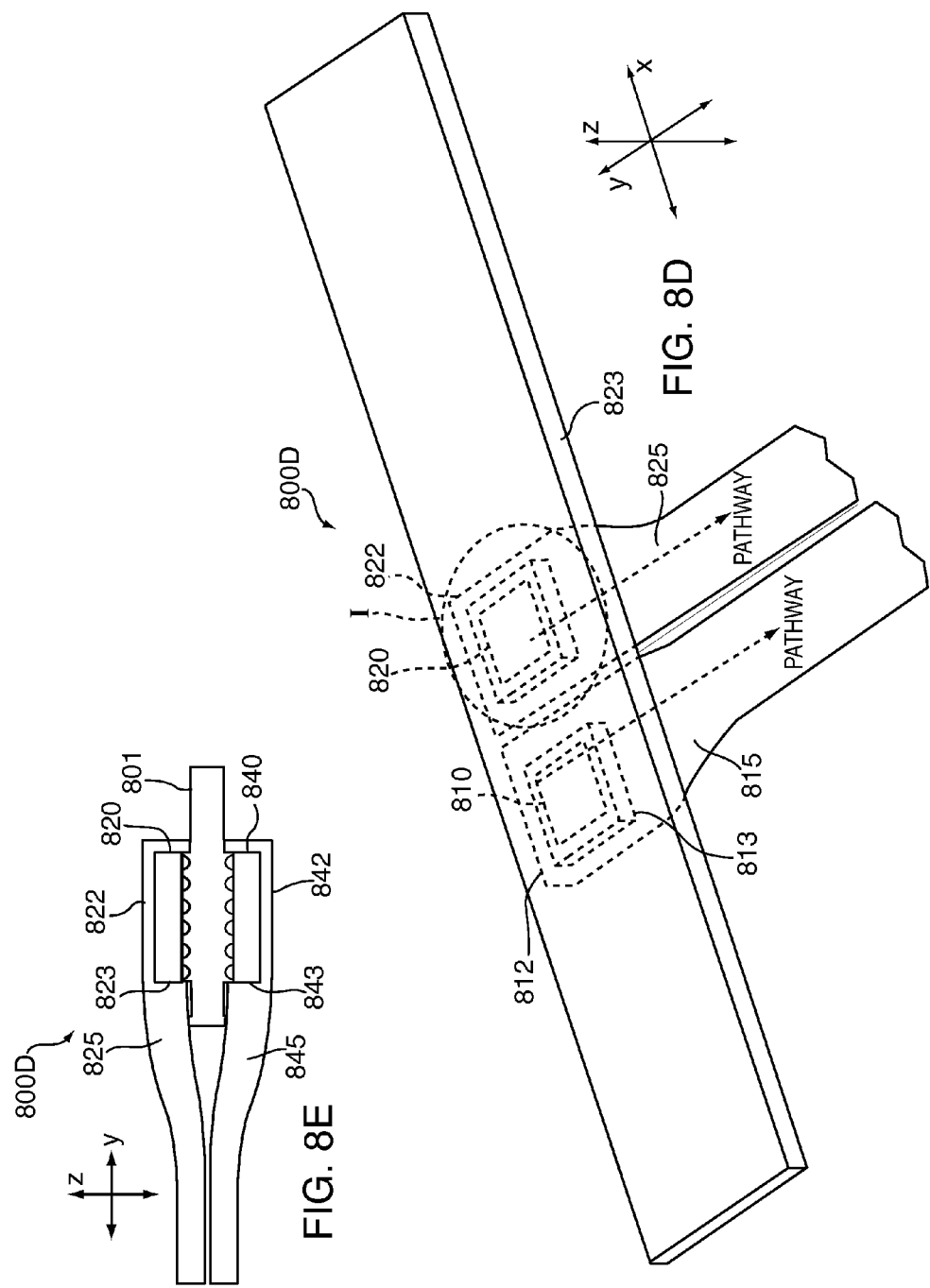

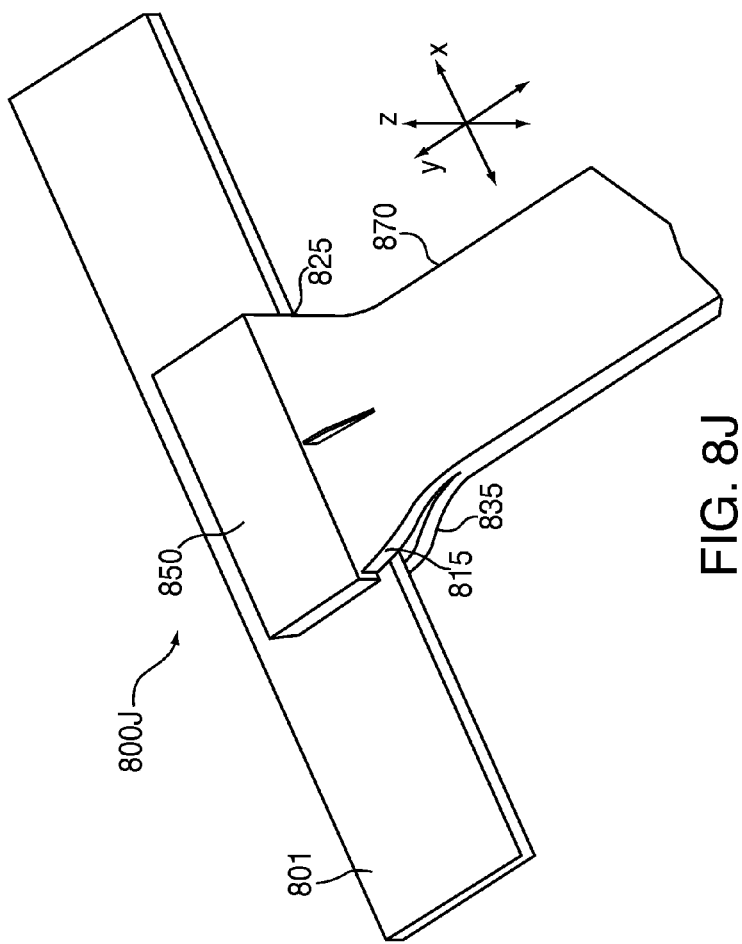
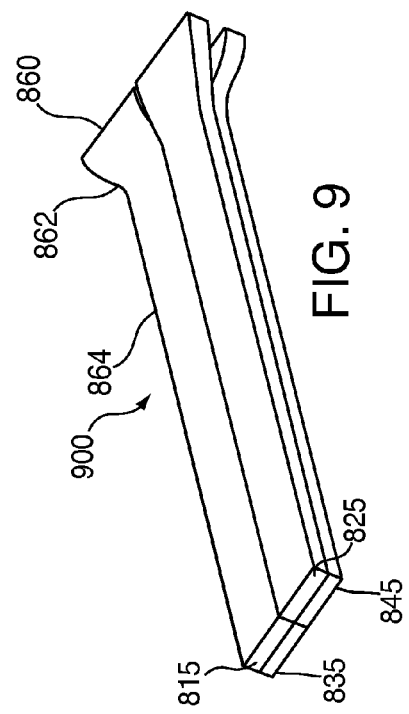
FIG. 8J
FIG. 9

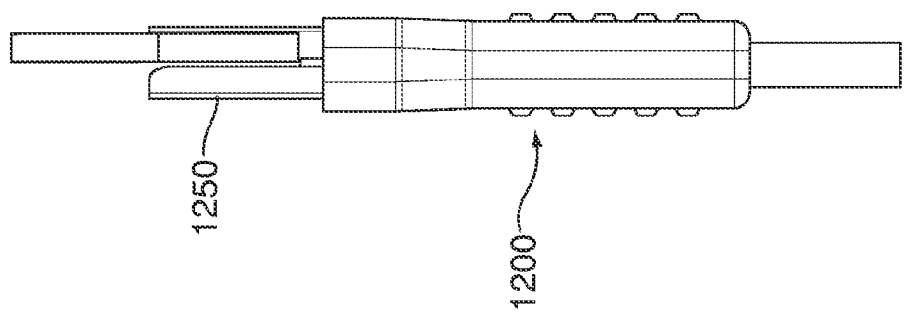
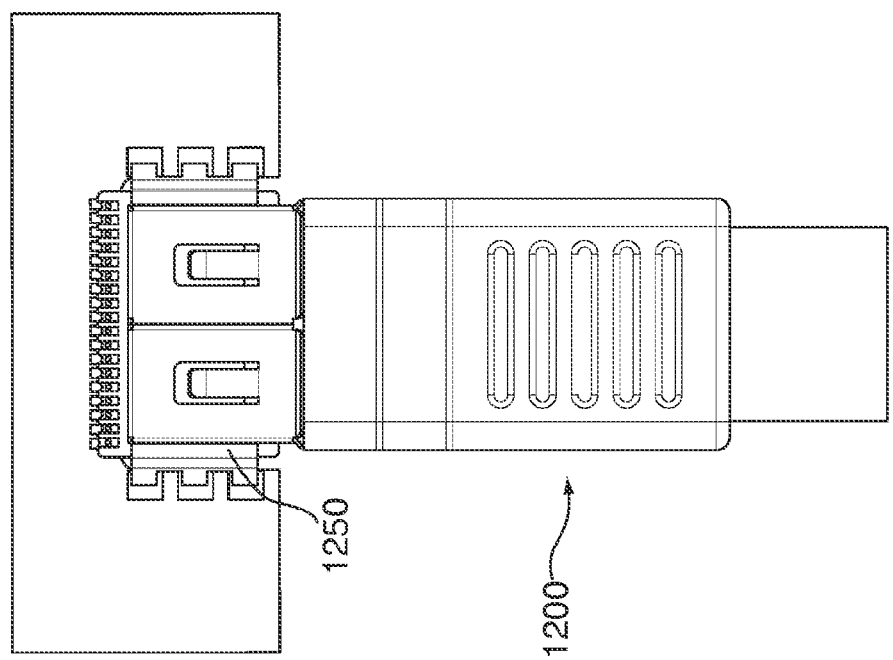

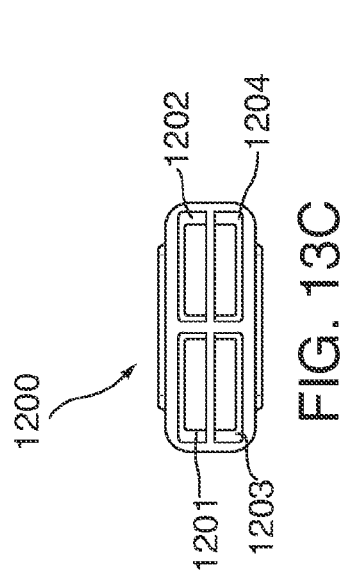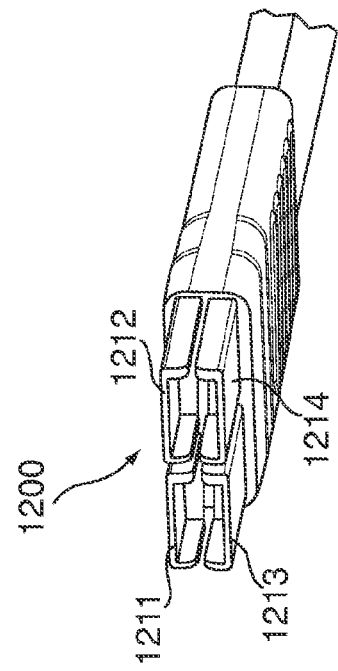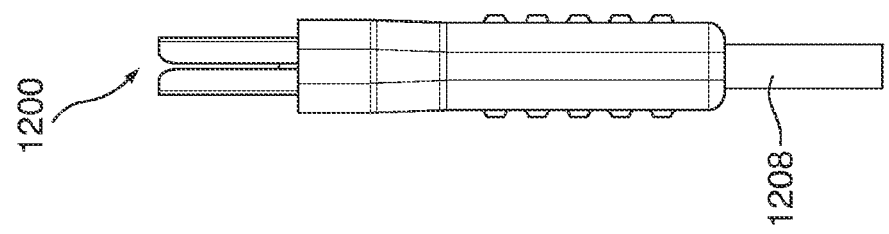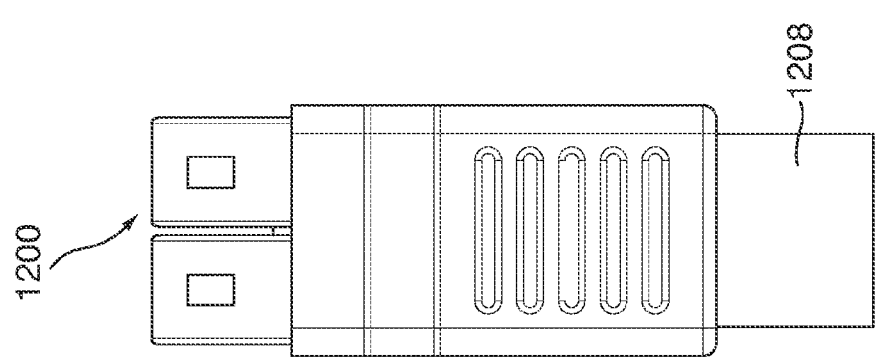

CONTACTLESS COMMUNICATION UNIT CONNECTOR ASSEMBLIES

RELATED APPLICATION

This application claims the benefit of U.S. Provisional Patent Application No. 61/865,542 filed Aug. 13, 2013, the disclosure of which is incorporated by reference in its entirety for all purposes.

FIELD OF THE INVENTION

The present disclosure relates to contactless connector assemblies and more specifically to contactless connector assemblies that control a signaling pathway of extremely high frequency signals.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

BRIEF SUMMARY

Contactless extremely high frequency (EHF) connector assemblies, passive cable connector assemblies, and active cable connector assemblies are disclosed herein. In one embodiment, a contactless connector assembly can include several extremely high frequency (EHF) contactless communication units (CCUs) operable to selectively transmit and receive EHF signals, and several signal directing structures coupled to the EHF CCUs. The signal directing structures can direct the EHF signals along a plurality of EHF signal pathways.

A passive cable connector assembly can be embodied in a dielectric coupling structure for use in interfacing with at least one signal directing structure of a connector assembly. The coupling structure can include several waveguides arranged in a bundled array. The bundled array can include an interface portion that interfaces with the at least one signal directing structure, a taper portion, and an extension portion, wherein a cross-section of the interface portion exceeds a cross-section of the extension portion. The bundled array can exist as a multi-row, multi-column array or as a single row, multi-column array.

An active cable connector assembly can be embodied in a contactless connector assembly that includes a substrate including a first surface and a first axis, a plurality of EHF contactless communication units (CCUs) mounted to the first surface of the substrate and along the first axis, wherein each EHF CCU selectively transmits and receives EHF signals. The connector assembly can include a signal directing structure coupled to the plurality of EHF CCUs. The signal directing structure can include several signal shaping encapsulants each constructed to at least partially cover one of the EHF CCUs and direct EHF signals associated with that one EHF CCU along an EHF signal pathway.

A compact, multi-row, multi-column contactless connector assembly can include a substrate including first and second surfaces and a first axis, a first plurality of EHF contactless communication units (CCUs) mounted to the first surface of the substrate and along the first axis, wherein each EHF CCU selectively transmits and receives EHF signals, and a second plurality of EHF contactless communication units (CCUs) mounted to the second surface of the substrate and along the first axis, wherein each EHF CCU selectively transmits and receives EHF signals. The connector assembly can also include at least a first signal directing structure coupled to the first plurality of EHF CCUs, and at least a second signal directing structure coupled to the second plurality of EHF CCUs. The first and second signal directing structures can direct the EHF signals associated with each EHF CCU along a EHF signal pathway.

BRIEF DESCRIPTION OF THE DRAWINGS

Figure 1:
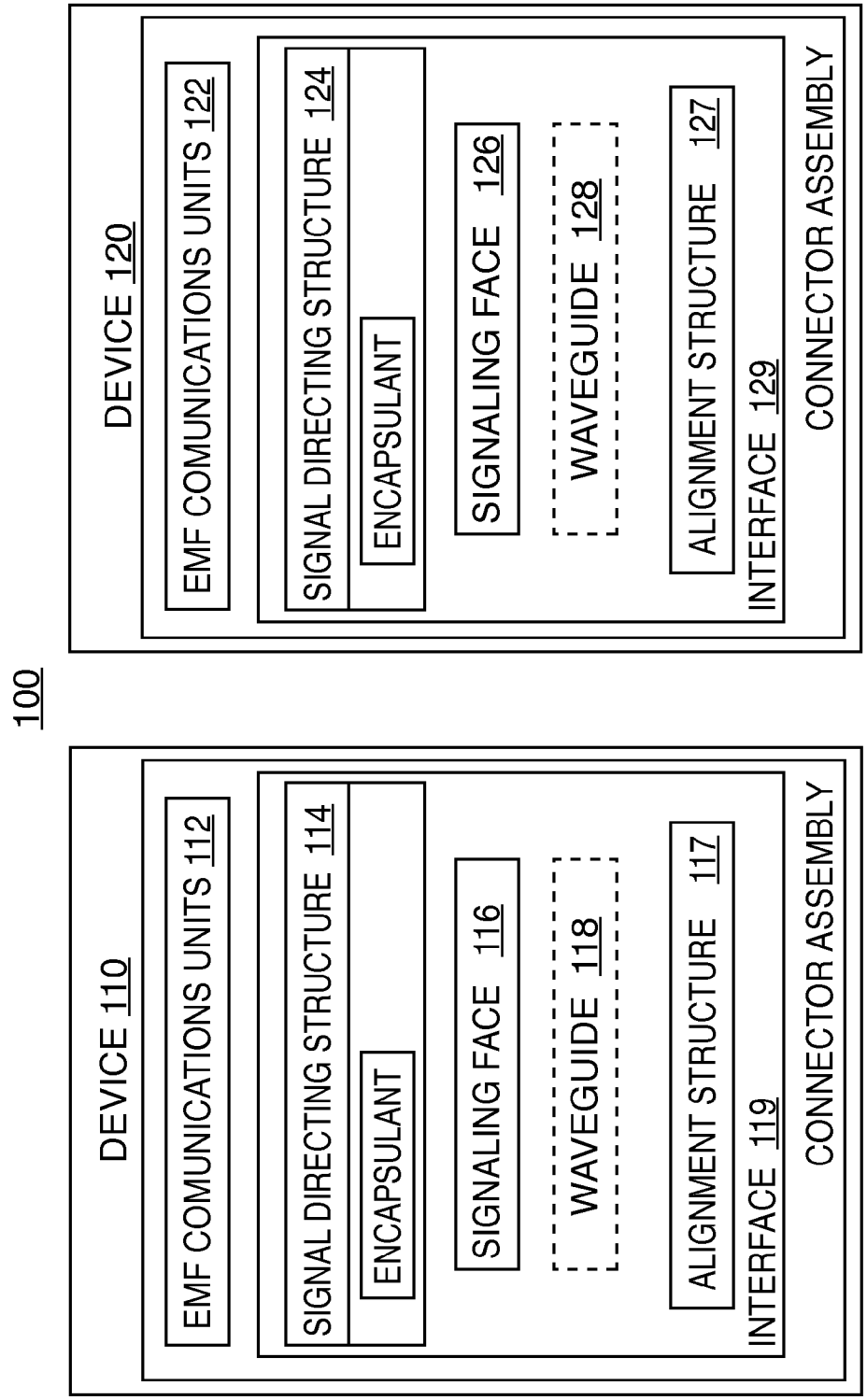
Figure 2:
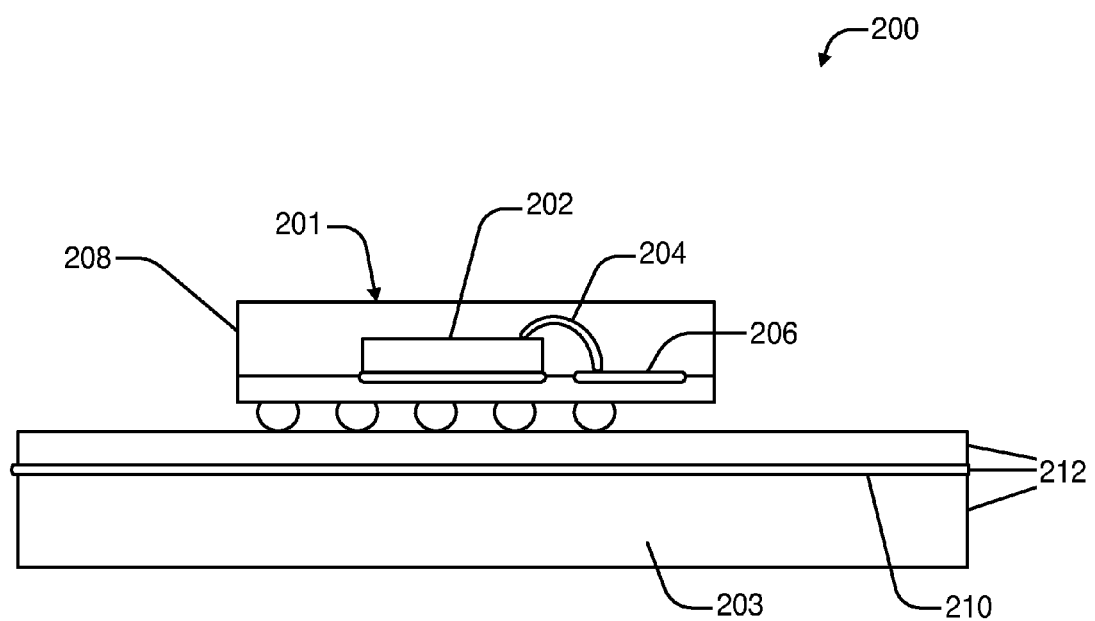
Figure 3:
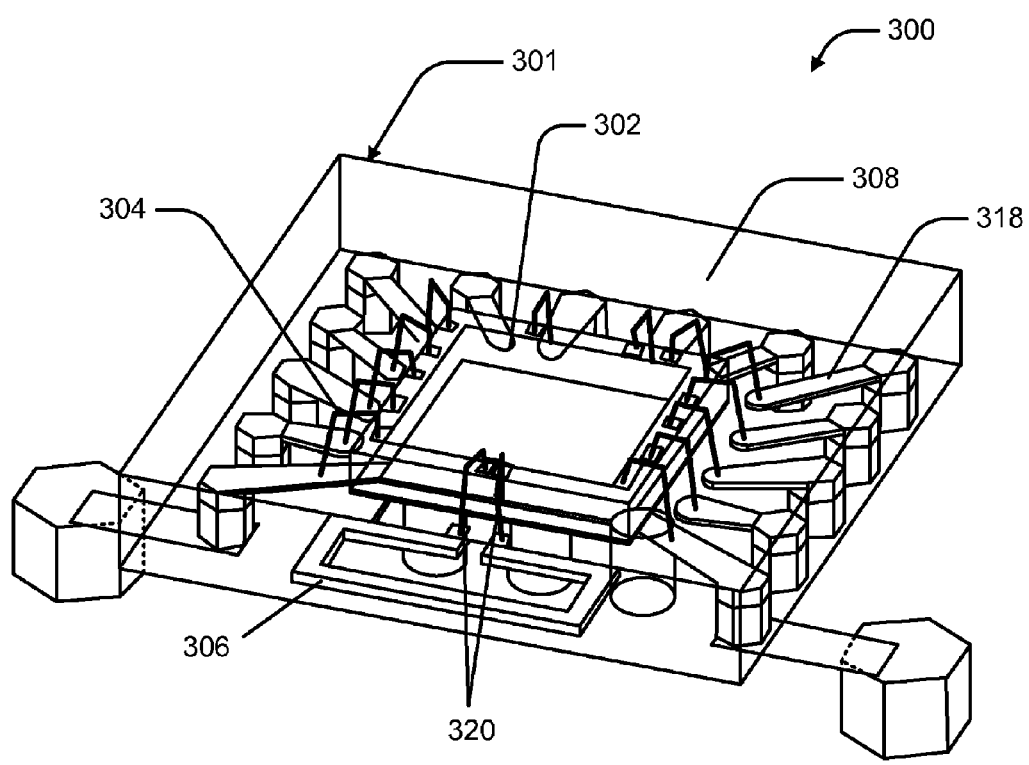
Figure 4:
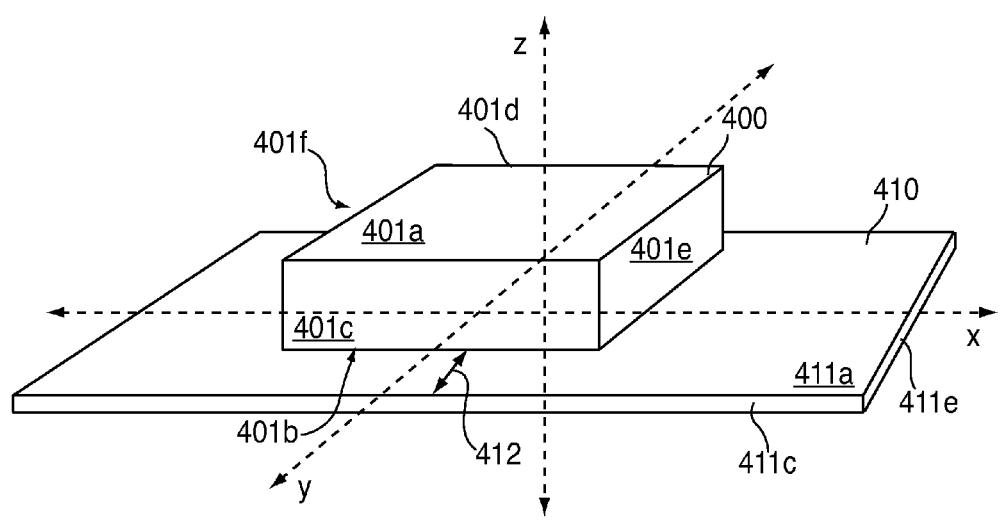
Figure 5:
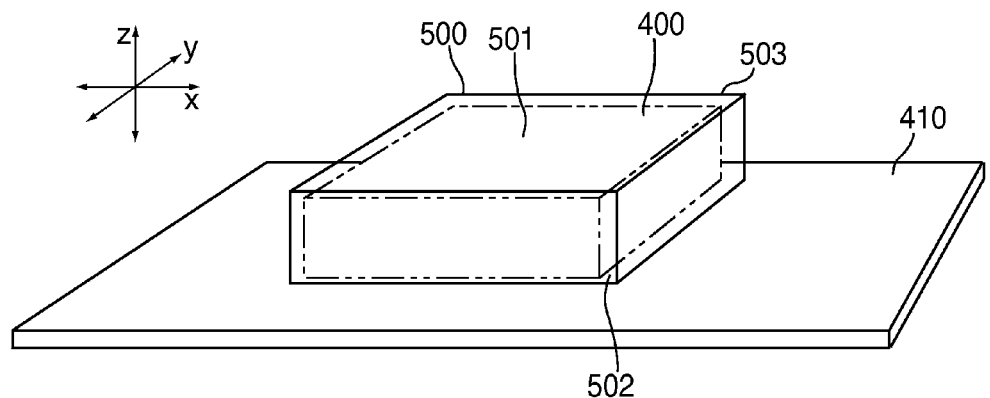
Figure 6:
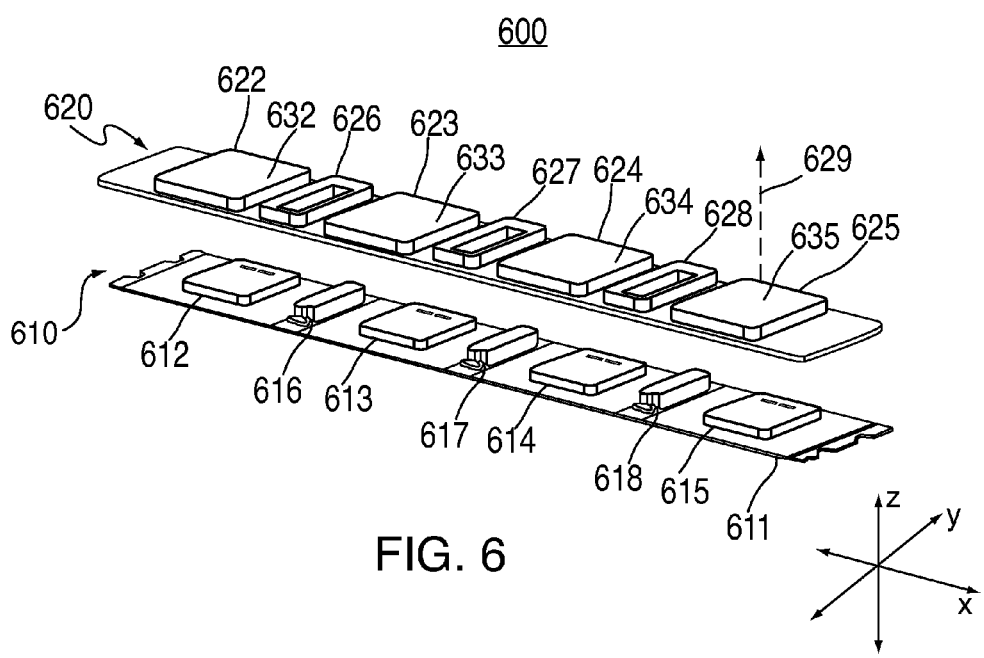
Figure 7:
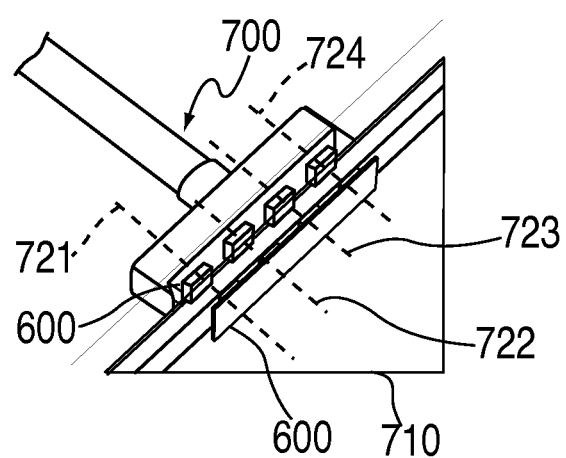
Figure 10:
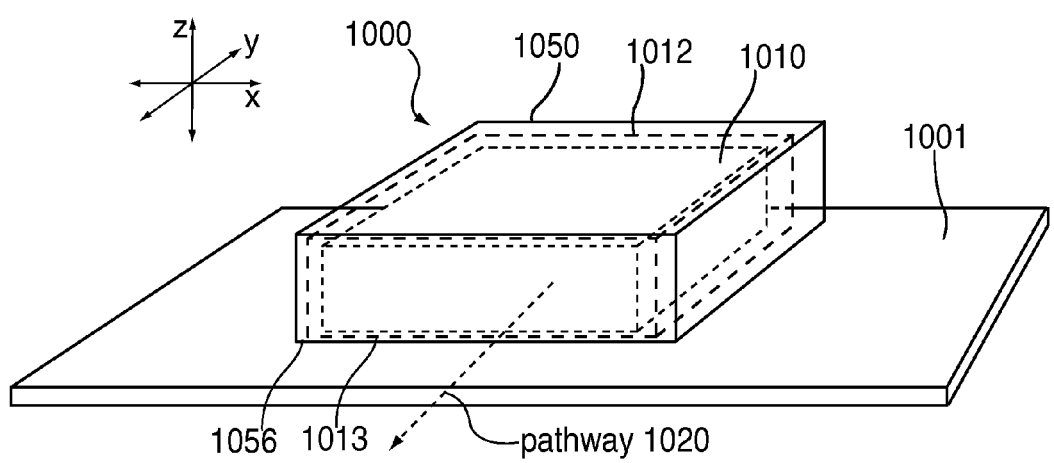
Figure 11A:
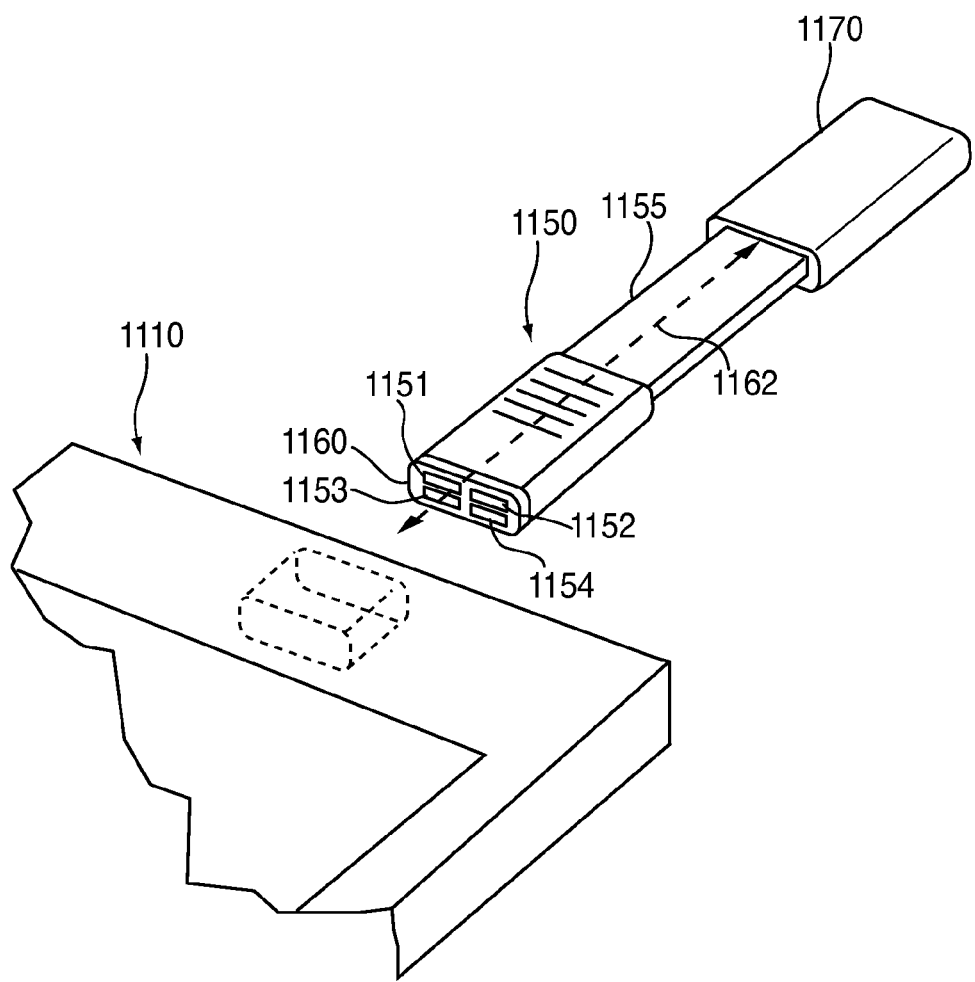
Figure 11B:
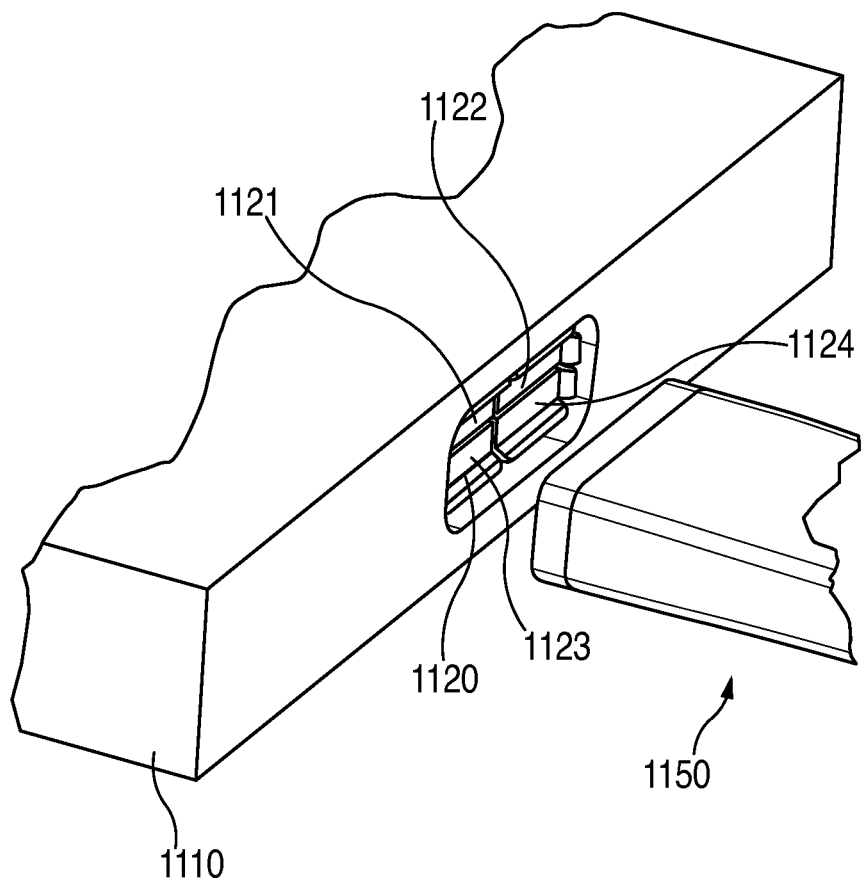
Figure 14D:
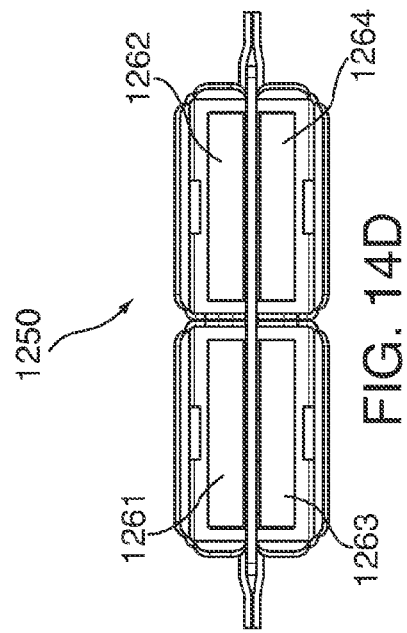
Figure 14C:
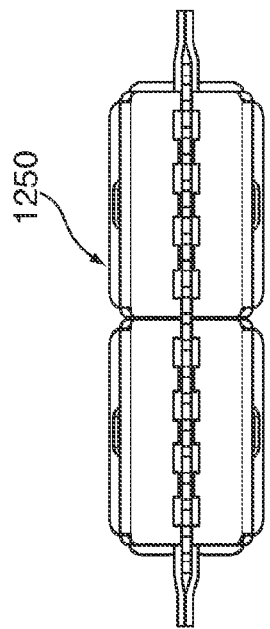
Figure 14B:
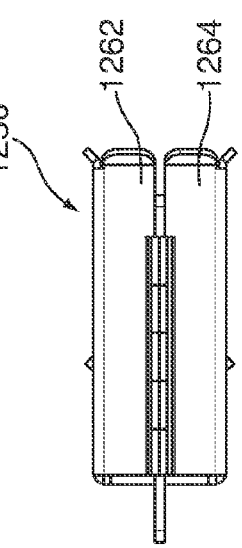
Figure 14A:
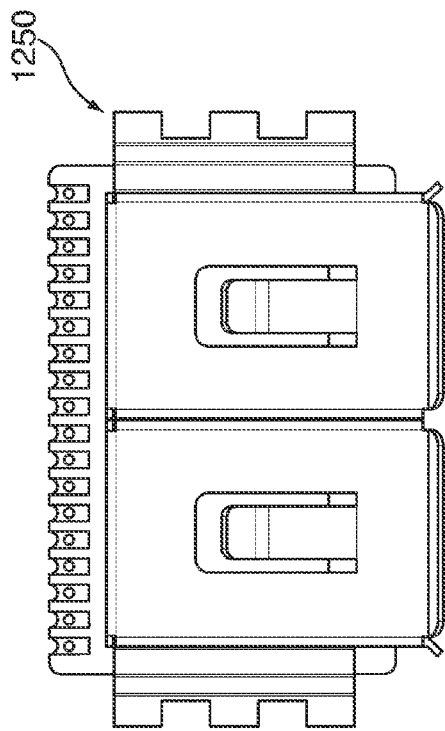
Figure 14E:
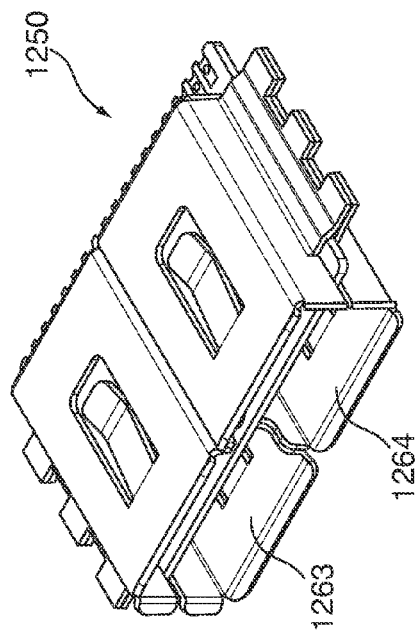
Figure 14G:
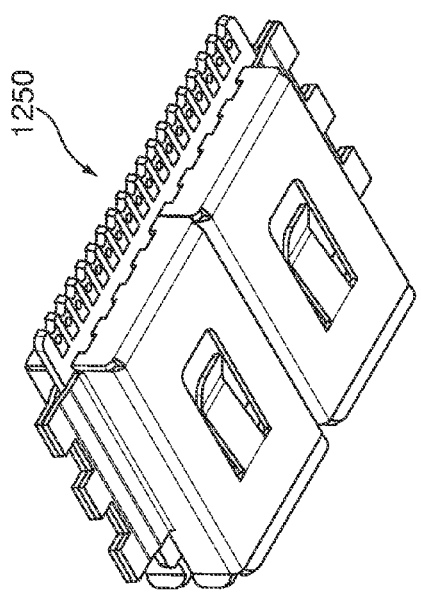
Figure 14F:
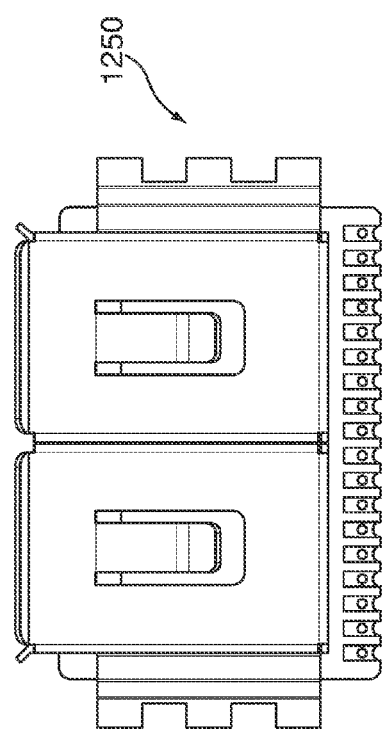
Figure 15:
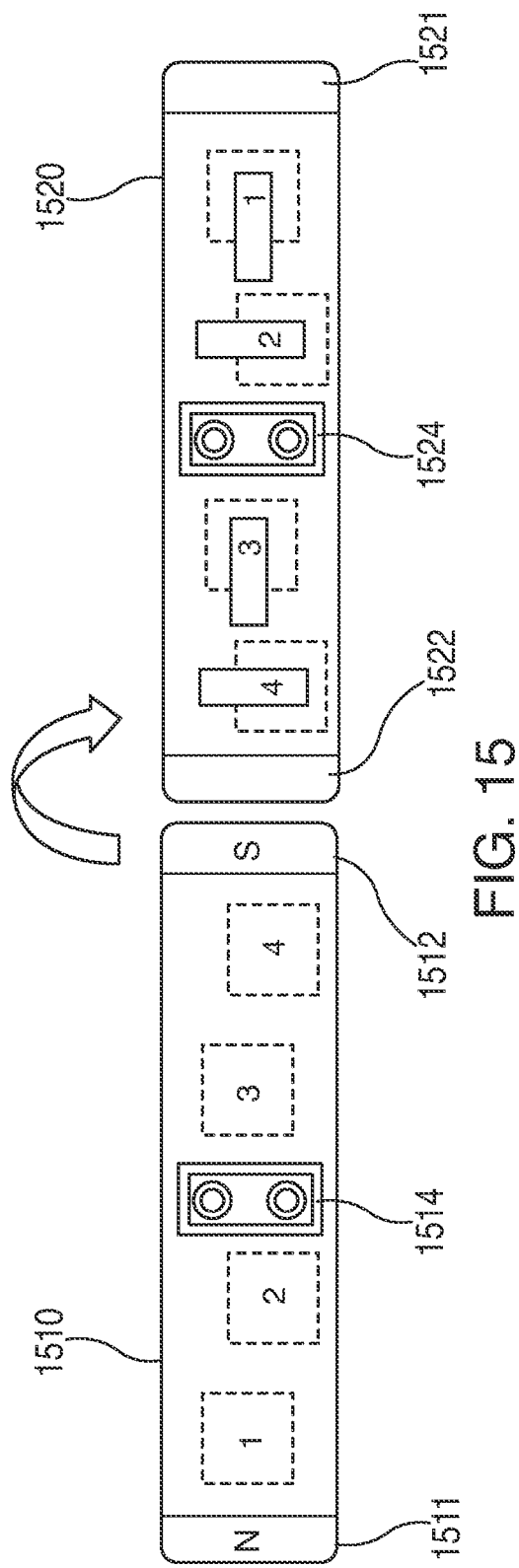
Figure 16A:
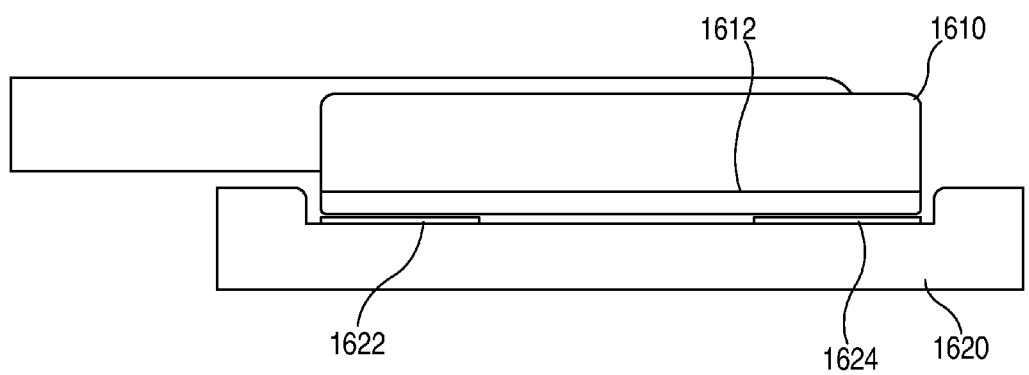
Figure 16B:
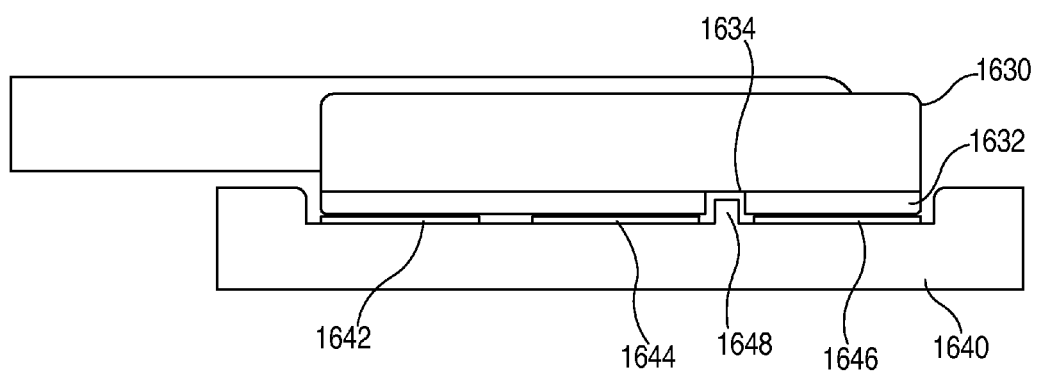
Figure 16C:
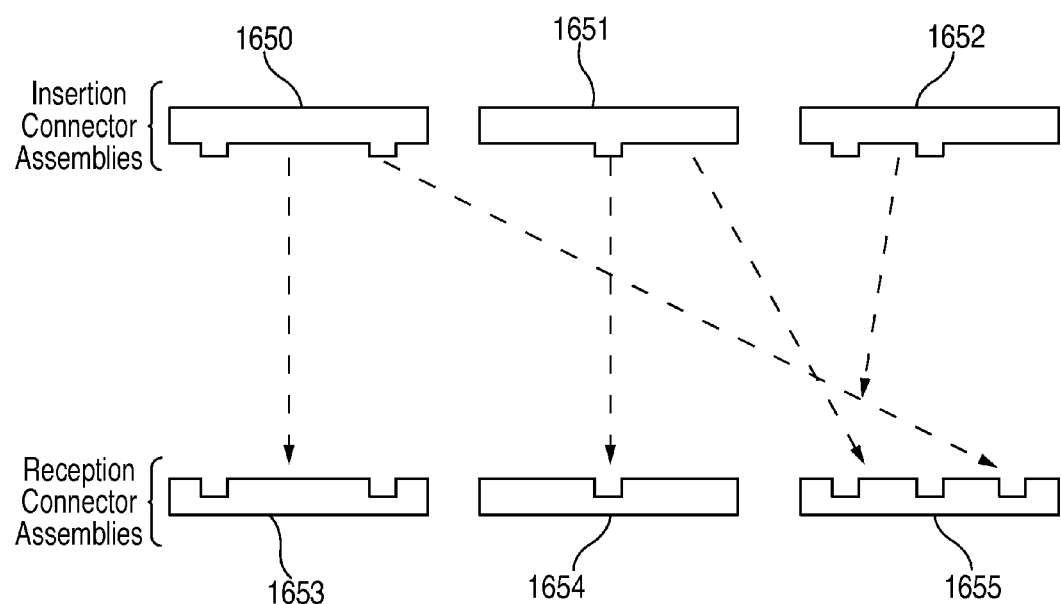

Having thus described communication between devices in general terms, reference is now made to the accompanying drawings, which are not necessarily drawn to scale, and wherein:

FIG. 1 illustrates an embodiment of a communication system;

FIG. 2 is a side view of a first example of an EHF communication unit useable in the system of FIG. 1;

FIG. 3 is an isometric view of a second example of an EHF communication unit;

FIG. 4 shows an illustrative EHF CCU mounted to a substrate, according to an embodiment;

FIG. 5 shows the EHF CCU of FIG. 4, but with the addition of an illustrative signal directing structure, according to an embodiment;

FIG. 6 shows an illustrative exploded view of a contactless connector assembly, according to an embodiment;

FIG. 7 shows an illustrative EHF signal pathway according to an embodiment;

FIGS. 8A-8J show a contactless connector assembly at different stages of construction according to various embodiments;

FIG. 9 shows an illustrative four channel bundled waveguide according to an embodiment;

FIG. 10 shows a perspective view of an illustrative connector assembly, according to an embodiment;

FIGS. 11A and 11B show illustrative views of two devices that can be connected together using connector assemblies according to various embodiments;

FIGS. 12A and 12B show illustrative top and side views of two connector assemblies connected together according to an embodiment;

FIGS. 13A-13D show different views of a connector assembly, according to an embodiment;

FIGS. 14A-14G show different views of another connector assembly, according to an embodiment;

FIG. 15 shows several magnet alignment embodiments for first and second devices;

FIGS. 16A-16C show several different alignment structure embodiments for selectively pairing two connector assemblies together; and FIGS. 17A-17E show several different surface textures of various connector assemblies according to various embodiments.

DETAILED DESCRIPTION

Illustrative embodiments are now described more fully hereinafter with reference to the accompanying drawings, in which representative examples are shown. The disclosed communication system and method may be embodied in many different forms and should not be construed as limited to the embodiments set forth herein. Like numbers refer to like elements throughout.

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

In today's society and ubiquitous computing environment, high-bandwidth modular and portable electronic devices are being used increasingly. Security and stability of communication between and within these devices is important to their operation. In order to provide improved secure high-bandwidth communications, the unique capabilities of contactless communication between electronic devices and between sub-circuits within each device may be utilized in innovative and useful arrangements.

Such communication may occur between radio frequency communication units, and communication at very close distances may be achieved using EHF frequencies (typically, 30-300 GHz) in an EHF communication unit. An example of an EHF communications unit is an EHF comm-link chip. Throughout this disclosure, the terms comm-link chip, and comm-link chip package are used to refer to EHF antennas embedded in IC chips or packages. Examples of such comm-link chips can be found, for example, in U.S. Patent Application Publication Nos. 2012/0263244 and 2012/0307932. Comm-link chips are an example of a communication device, also referred to as communication unit, whether or not they provide wireless communication and whether or not they operate in the EHF frequency band.

The acronym "EHF" stands for Extremely High Frequency, and refers to a portion of the electromagnetic (EM) spectrum in the range of 30 GHz to 300 GHz (gigahertz). The term "transceiver" may refer to a device such as an IC (integrated circuit) including a transmitter (Tx) and a receiver (Rx) so that the integrated circuit may be used to both transmit and receive information (data). Generally, a transceiver may be operable in a half-duplex mode (alternating between transmitting and receiving), a full-duplex mode (transmitting and receiving simultaneously), or configured as either a transmitter or a receiver. A transceiver may include separate integrated circuits for transmit and receive functions. The terms "contactless," "coupled pair," and "close proximity coupling" as used herein, refer to electromagnetic (EM) rather than electrical (wired, contact-based) connections and transport of signals between entities (such as devices). As used herein, the term "contactless" may refer to a carrier-assisted, dielectric coupling system. The connection may be validated by proximity of one device to a second device. Multiple contactless transmitters and receivers may occupy a small space. A contactless link established with electromagnetics (EM) may be point-to-point in contrast with a wireless link which typically broadcasts to several points.

The RF energy output by the EHF transceivers described herein may be below FCC requirements for certification or for transmitting an identification (ID) code which would otherwise interrupt data flow during the data transfer.

FIG. 1 illustrates a communication system 100. As shown, system 100 may include a first device 110 configured to couple to a second device 120. First device 110 may be configured to communicate with and/or connect to second device 120 and vice versa. Further, first device 110 and second device 120 can be electronic devices capable of connecting and communicating with each other. First device 110 may couple directly to device 120 via their respective interfaces 119 and 129, or a cable device (not shown) or other device (not shown) can couple the two devices together. For example, device 110 can be a device such as a mobile device or a computer, and device 120 can be a cable device designed to interface with the device 110. First device 110 may include one or more EHF contactless communication units (CCUs) 112, signal directing structure 114, one or more signaling faces 116, one or more alignment structures 117, optional waveguide 118, and interface 119. Interface 119 can represent a combination of one or more of signal directing structure 114, signaling faces 116, one or more alignment structures 117, and waveguide 118. Similarly, second device 120 may include one or more EHF contactless communication units (CCUs) 122, signal directing structure 124, one or more signaling faces 126, one or more alignment structures 127, optional waveguide 128, and interface 129. Interface 129 can represent a combination of one or more of signal directing structures 124, signaling faces 126, one or more alignment structures 127, and waveguide 128.

EHF CCUs 112 and 122 can be an EHF transceiver capable of selectively transmitting and receiving EHF signals. When operating as a transmitter, the EHF CCUs may transmit an electromagnetic EHF signal, and when operating as receiver, the EHF CCUs may receive an electromagnetic EHF signal. For example, in one embodiment, device 110 can include two EHF CCUs and device 120 can include two EHF CCUs. In device 110, a first EHF CCU may operate as a transmitter and a second EHF CCU may operate as a receiver. Similarly, device 120 may include first and second EHF CCUs that operate as transmitter and receiver, respectively. The transmitter EHF CCU of device 110 may transmit EHF signals to the receiver EHF CCU of device 120, and the transmitter EHF CCU of device 120 may transmit EHF signals to the receiver EHF CCU of device 110.

Signal directing structures 114 and 124 may be used to guide EHF signals to and from EHF CCUs. Each EHF CCU may exhibit a radiation field when transmitting and/or receiving an EHF signal. The dimensions of a radiation field associated with a first EHF CCU can potentially overlap the radiation field of one or more other EHF CCUs. Such overlap can cause cross-talk or interference with EHF signaling. Signal directing structures 114 and 124 can direct or focus EHF signal energy into a cross sectional area smaller than the transverse dimensions of the EHF CCU's radiation field. As a result, the EHF signals can be focused to travel along a desired signal path and away from undesirable paths. Signal directing structures 114 and 124 may constructed to exhibit any suitable shape. For example, the structures may include an encapsulant that partially or fully covers an EHF CCU. As another example, the structures may be characterized as a signal collimating structure (e.g., a chimney) that surrounds an EHF CCU, but has an open channel for an EHF signal pathway.

Signal directing structures can be constructed from a combination of different materials to shape the direction of signal propagation and to mitigate EHF leakage (which may cause cross-talk). These materials can include transmissive materials that are operable to facilitate propagation of EHF signals, reflective materials that are operable to reflect EHF signals, and absorptive materials that are operable to absorb EHF signals. Examples of transmissive materials can include plastics and other materials that are electrically non-conductive (i.e., dielectric). Reflective materials can include, for example, metals, metal alloys, and other materials that are electrically conductive. Examples of absorptive materials can include, for example, magnetically loaded, rubber materials that are electrically non-conductive, but exhibit effective EHF dampening resonance due to their high permittivity and permeability. A specific example of an absorptive material is sold as Eccosorb, by Emerson & Cuming Microwave Products of Randolph, Mass.

In some embodiments, the signal directing structures can be constructed from just one of the different material types. For example, the signal directing structure can be constructed from just the conductive material or just the reflective material. In other embodiments, the structure can be constructed from two or more of the different material types. For example, the signal directing structure can be constructed from transmissive and reflective materials, from transmissive and absorptive materials, or from reflective and absorptive materials. As yet another example, structures 114 and 124 can be constructed from transmissive, reflective, and absorptive materials.

Signaling faces 116 and 126 can represent physical or virtual locations within each device where EHF signals enter and exit signal directing structures 114 and 124. In some embodiments, face 116 can be part of signal directing structure 114 and face 126 can be part of signal directing structure 124. In other embodiments, face 116 can represent a region or portion that isn't embodied in a physical piece of hardware, but exist at or near an integrated circuit or signal directing structure. The number of faces included with each of device 110 and 120 may be based on the number of EHF CCUs or the number of desired signaling pathways. Each face may include a focal axis that defines the primary axis by which EHF signal energy travels. The focal axis may be orthogonal to the face.

Alignment structures 117 and 127 may provide axial and proximal alignment of the EHF CCUs between devices 110 and 120 (e.g., alignment of a transmitter CCU in device 110 with a receiver CCU in device 120). The proper alignment of CCU pairs may allow EHF signal communication between at least one of the pairs of transmitter and receiver and thus communication between the two devices. In addition, alignment structures 117 and 127 may provide guidance for device to device connection, and may also provide a keying structure to limit orientation of a connection. Alignment structures 117 and 127 may include various alignment elements such as magnets, conductive plates, pogo pins or other pins, grooves, channels, depressions, curves, interlocking keying members, or any other structure that can guide users to intuitively connect devices. For example, magnetic alignment elements may be used to guide users to place devices in a predetermined spatial orientation. Various other examples are discussed below in connection with FIGS. 15-17. In some embodiments, alignment structures 117 and 127 may be arranged to permit universal connections or they may be arranged to provide specifically oriented connections.

In some embodiments, alignment structures 117 and 127 may transmit power between devices 110 and 120. For example, metal plates or pins that are integrated into the connector interface may be designed to transmit or receive power. In a specific example, device 110 may provide power to device 120 via the alignment structures when the two devices are connected together. This way, the EHF CCUs (and other circuitry) of device 120 can be provided with a source of power when device 120 does not have its own source of power. In another example, power can be routed through one or both waveguides 118 and 128 to circuitry contained in the connector assembly interface. In such an example, the waveguide can simultaneously serve as a conduit for EHF signal transmission and power transmission.

In yet other embodiments, alignment structures 117 and 127 may provide alternative signaling to the EHF communications, for example, to announce the presence of one device to another. This alternative signaling may be enabled when alignments structures 117 and 127 interface with each other. For example, a switch may be activated when structures 117 and 127 interface with each other and de-activated when they are no longer interfaced together.

Optional waveguides 118 and 128 can be a contiguous dielectric transmission medium for EHF signals. Waveguides 118 and 128 may be used to increase the contactless coupling distance between devices. Waveguides can enhance signal transfer between paired EHF CCUs by further reducing crosstalk among adjacent EHF CCUs located on the same connector assembly and/or between diagonally opposite EHF CCUs in 2 different connector assemblies or devices. Waveguides may accomplish this by further directing the transmission path of the EHF signals. In some embodiments, a waveguide can be associated with each EHF CCU of a device, thereby resulting in a device having multiple waveguides. If desired, even though each waveguide originates at its associated EHF CCU, multiple waveguides may be combined into a single integrated waveguide cable. Various examples of waveguides are discussed below in connection with FIG. 9.

The desired design, shape, and signaling characteristics of interfaces 119 and 129 can be selected by adjusting the material composition, shapes, and configurations of the signal directing structures, signal faces, waveguides, and alignment structures. This advantageously provides improved design freedom for device interfaces. Interfaces according to embodiments discussed herein are not limited to standard connectors (e.g., USB connectors) that are conventionally used to transact large data transfers. These standard connectors typically require physical mating surfaces to establish a connection and are susceptible to wear from frequent use and water damage, and require precise alignment to create electrical connections. The embodiments discussed herein further show how design flexibility is enhanced by directing the EHF signals to travel along one or more pathways between devices with minimal or no crosstalk.

FIG. 2 is a side view of an exemplary EHF communication circuit 200 showing a simplified view of some structural components. As illustrated, the communication circuit may include an integrated circuit package 201 that includes a die 202 mounted on a connector printed circuit board (PCB) 203, a lead frame (not shown), one or more conductive connectors such as bond wires 204, a transducer such as antenna 206, and an encapsulating material 208.

Die 202 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. Die 202 may be mounted in electrical communication with the lead frame. The lead frame (similar to lead frame 318 of FIG. 3) may be any suitable arrangement of electrically conductive leads configured to allow one or more other circuits to operatively connect with die 202. The leads of the lead frame may be embedded or fixed in a lead frame substrate. The lead frame substrate may be formed using any suitable insulating material configured to substantially hold the leads in a predetermined arrangement.

Further, the electrical communication between die 202 and leads of the lead frame may be accomplished by any suitable method using conductive connectors such as, one or more bond wires 204. Bond wires 204 may be used to electrically connect points on a circuit of die 202 with corresponding leads on the lead frame. In another embodiment, die 202 may be inverted and use conductive connectors including bumps, or die solder balls rather than bond wires 204, which may be configured in what is commonly known as a "flip chip" arrangement. Antenna or transducer element 206 may be any suitable structure configured as a transducer or antenna to convert between electrical and electromagnetic signals. Element 206 may be configured to operate in an EHF spectrum, and may be configured to transmit and/or receive electromagnetic signals, in other words as a transmitter, a receiver, or a transceiver. In an embodiment, element 206 may be constructed as a part of the lead frame. IC package 201 may include more than one element 206. In another embodiment, element 206 may be separate from, but operatively connected to die 202 by any suitable method, and may be located adjacent to die 202. For example, element 206 may be connected to die 202 using antenna bond wires (similar to 320 of FIG. 3). Alternatively, in a flip chip configuration, the element 206 may be connected to die 202 without the use of the bond wires (see element 320). In other embodiments, element 206 may be disposed on die 202 or on PCB 203.

Encapsulating material 208 may hold the various components of IC package 201 in fixed relative positions. Encapsulating material 208 may be any suitable material configured to provide electrical insulation and physical protection for the electrical and electronic components of the IC package. For example, encapsulating material 208 may be a mold compound, glass, plastic, ceramic, or any combination thereof. Encapsulating material 208 may be formed in any suitable shape. For example, encapsulating material 208 may be in the form of a rectangular block, encapsulating all components of the IC package except the unconnected leads of the lead frame. One or more external connections may be formed with other circuits or components. For example, external connections may include ball pads and/or external solder balls for connection to a printed circuit board. Encapsulating material 208, along with other components of IC package 201, may have a dielectric value, referred to herein as $D_{CCU}$. This dielectric value may be a consideration taken into account by various interface embodiments herein to achieve optimal signal direction orientation.

IC package 201 may be mounted on a connector PCB 203. Connector PCB 203 may include one or more laminated layers 212, one of which may be a PCB ground plane 210. PCB ground plane 210 may be any suitable structure configured to provide an electrical ground to circuits and components on the IC package. With the placement of the ground layer, at an appropriate distance from the antenna, the electromagnetic radiation pattern may be directed outwards from the substrate.

FIG. 3 is a simplified isometric view of another example of an EHF contactless communication circuit 300 showing some structural components. As illustrated, communication circuit 300 may include an IC package 301 that may in turn include a die 302, a lead frame 318, one or more conductive connectors such as bond wires 304, a transducer such as element 306, one or more antenna bond wires 320, and an encapsulating material 308. Die 302, lead frame 318, one or more bond wires 304, element 306, element bond wires 320, and an encapsulating material may be functionally similar to components such as die 202, bond wires 204, element 206, and encapsulating material 208 of IC package 201, respectively, as described in FIG. 2. Further, communication circuit 300 may include a connector PCB similar to PCB 203 (not shown).

In FIG. 3, die 302 is encapsulated in encapsulating material 308, along with the bond wires 304 and 320. In this embodiment, the IC package may be mounted on the connector PCB. The connector PCB may include one or more laminated layers, one of which may be a PCB ground plane. The PCB ground plane may be any suitable structure configured to provide an electrical ground to circuits and components on the PCB. With the placement of the ground layer, at an appropriate distance from the antenna, the electromagnetic radiation pattern may be directed outwards from the substrate. Encapsulating material 308, along with other components of IC package 301, may have a dielectric value, $D_{CCU}$. This dielectric value may be a consideration taken into account by various interface embodiments herein to achieve optimal signal direction orientation.

FIG. 4 shows a grossly simplified and illustrative EHF CCU 400 mounted to substrate 410, according to an embodiment. FIG. 4 can represent a starting point before a signal directing structure is coupled to CCU 400. As shown, CCU 400 can be characterized as having six sides, shown as 401*a-f*. Similarly, substrate 410 can also be characterized as having six sides, only three of which are labeled (i.e., 411*a*, 411*c*, and 411*e*). CCU side 401*b* is shown to be mounted to board side 411*a*. In other words, CCU 400 may be mounted to a first surface of substrate 410. CCU 400 may be mounted such that side 401*c* is positioned a distance 412 away from the side 411*c*. Also shown in FIG. 4 are illustrative X, Y, and Z axes.

FIG. 5 shows the EHF CCU 400 of FIG. 4, but with the addition of an illustrative signal directing structure 500 disposed on or about CCU 400 and substrate 410, according to an embodiment. Signal directing structure 500 may fully encapsulate all exposed sides of CCU 400. That is, all sides other than the side mounted to substrate 410 may be encapsulated by signal directing structure 500. In one embodiment, signal directing structure 500 can be a pre-molded structure that fits snugly over CCU 400. In another embodiment, structure 500 can be applied as a mold directly onto CCU 400. Structure 500 can include signal face 501 (shown here as the top portion of structure 500) for directing EHF signals towards and away from CCU 400 in the direction of the Z axis. If desired, structure 500 can include more than one signal face for directing EHF signals towards and away from CCU 400. For example, structure 500 can include signaling faces on opposing sides (e.g., sides 502 and 503)

to direct signals along the Y axis. The signaling face can represent a region through which EHF signal energy is directed. The direction of EHF signal may be generally defined by a focal axis, which is orthogonal to the face. The focal axis can define a desired pathway for EHF signal transmission even though EHF signals may occupy space surrounding the focal axis.

In some embodiments, signal directing structure 500 can be a chimney structure, the hollow passageway of which may direct the EHF signals. The focal axis of the chimney structure may be orthogonal to a surface of the EHF CCU. In such an embodiment, the signaling face may be the EHF CCU.

FIG. 6 shows an illustrative exploded view of a contactless connector assembly 600, according to an embodiment. Assembly 600 can include EHF CCU array 610 and signal directing structure 620. EHF CCU array 610 can include substrate 611, EHF CCUs 612-615 aligned along the X axis, and signal inhibiting structures 616-618 positioned between adjacent CCUs as shown. Inhibiting structures 616-618 may further reduce cross-talk among the EHF CCUs. Signal directing structure 620 can be an integrated structure that includes encapsulating members 622-625 constructed to fit over a corresponding EHF CCU. Structure 620 can also include sleeve members 626-628 constructed to fit over corresponding signal inhibiting structures. Encapsulating members 622-625 may cover the five exposed sides of each EHF CCU, similar to how structure 500 covered EHF CCU 400 of FIG. 5. Members 622-625 each include respective signaling face 632-635 for directing EHF signal energy along a path orthogonal to the X-Y plane, or in the Z-axis direction. The focal axis (one of which is illustrated as axis 629) of each structure may be orthogonal (Z-axis) to signaling faces 632-635. Portions other than signaling faces 632-635 of each member may be designed and manufactured with materials that mitigate EHF signal propagation in the Y and X directions. Inhibiting structures 616-618 may inhibit signal propagation along the X direction.

Assembly 600 can be incorporated into a cable device such as cable device 700 (of FIG. 7) or an electronic device such as device 710 (of FIG. 7). As shown in FIG. 7, when device 700 is connected to device 710, pathways or lanes 721-724 can exist for transmitting signals between devices 700 and 710. Each pathway may correspond to a coupled pair of EHF CCUs and represents a desired signal path. As shown, because the EHF CCUs of assembly 600 are arranged in a single row, the pathways corresponding thereto are parallel and coplanar. Not shown in FIG. 7 are alignment structures, but it is understood that various alignment structures (e.g., structures 117 and 127) may be used to assist in connecting device 700 and 710 together.

Figure 8F:
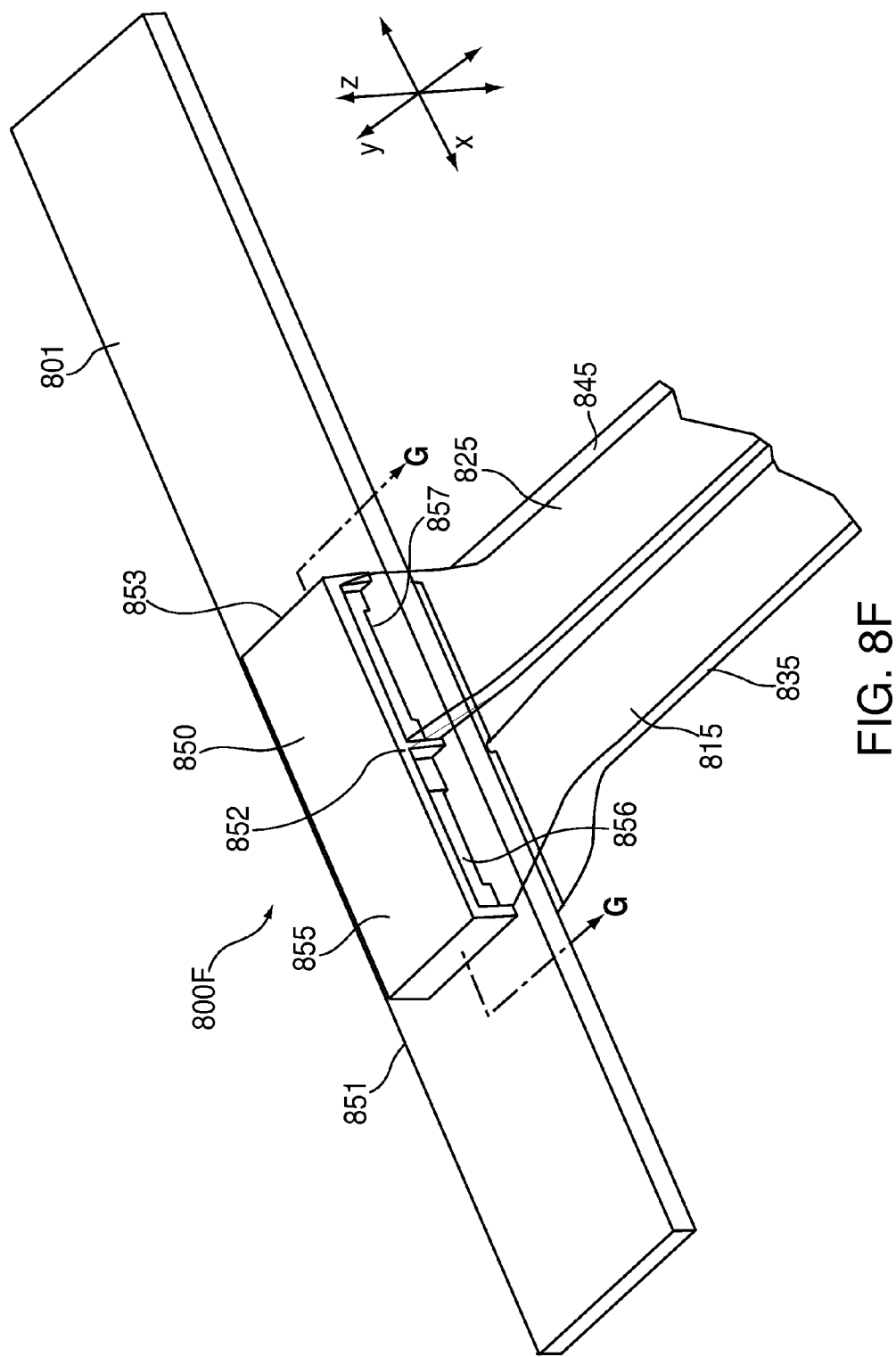

FIGS. 8A-8J show a contactless connector assembly at different stages of construction according to embodiments of the invention. FIG. 8A shows an illustrative perspective view of assembly 800A that can include substrate 801, EHF CCUs 810 and 820, and dielectric encapsulants 812 and 822. Encapsulants 812 and 822 may form part their respective signal shaping structures. Assembly 800A can include additional CCUs and encapsulants mounted to a second surface of substrate (shown in FIG. 8B, which shows an illustrative side view of assembly 800A). FIG. 8C shows an illustrative top view of assembly 800A. CCUs 810 and 820 are mounted to a first surface of substrate 801 and encapsulants 812 and 822 form at least a partial boundary around CCUs 810 and 820, respectively. Dielectric encapsulants 812 and 822 may form part of a signal shaping structure. In addition, dielectric encapsulant 812 and 822 may extend the effective dielectric boundary of the CCUs. As mentioned above in FIGS. 2 and 3, the CCU may exhibit its own dielectric boundary formed by the encapsulant (208 or 308) surrounding the IC package. The addition of encapsulants 812 and 822 extends this boundary and can further moderate variations in permittivity. Furthermore, use of encapsulants 812 and 822 can effectively reduce the overall size of the connector assembly.

FIG. 8B shows EHF CCUs 830 and 840 mounted to a second side of substrate 801. Encapsulants 832 and 842 are also shown to cover CCUs 830 and 840, respectively. Assuming each CCU is associated with a pathway or lane, assembly 800A may have four such pathways. The spacing requirement for the pathways of assembly 800A is half that required of assembly 600 because two pathways are stacked on top of each other, as opposed to being arranged in a single row. This advantageously reduces the footprint required for constructing a connector assembly. Depending on design choice of the signal shaping structure, the direction of the pathways can be controlled to direct the EHF signal energy in a particular direction. For simplicity, assume that signaling faces 813, 823, 833, and 843 exist as shown. The position of signal faces 813, 823, 833, and 843 may enable the signal shaping structure to direct EHF signals in a first direction along the Y axis. As shown, the Y axis is in a plane parallel to the surface of substrate 801 and orthogonal to each of faces 813, 823, 833, and 843. In FIGS. 8A and 8C, the first direction may be directed towards direction A of the Y axis. Alternatively, the signal can be directed toward direction B of the Y axis, or in either direction along the Z axis.

FIG. 8C shows how encapsulants 812 and 822 can partially cover CCUs 810 and 820, respectively. As shown, encapsulant 812 and 822 can be aligned with faces 813 and 823, respectively, and not cover them, but can cover all other aspects of their respective CCUs. In other embodiments, not shown, the encapsulant may cover all five sides of the CCU. In yet another embodiment (not shown), the encapsulant may cover just three sides.

Referring now to FIG. 8D, another perspective view of assembly 800D is shown with waveguides 815 and 825. FIG. 8E shows an illustrative side view of assembly 800D with waveguides 825 and 845 according to an embodiment. As shown in FIGS. 8D and 8E, the waveguides abut the signaling face of its associated EHF CCU and complete a dielectric connection with the encapsulant associated with the EHF CCU. For example, waveguide 825 interfaces with encapsulant 822 at signaling face 823 to form a tuned waveguide. That is, the combination of the waveguide, encapsulant, and a conductive shield (shown in FIG. 8F) can form a tuned waveguide that directs EHF signals along the pathway shown moving in the direction of the Y axis.

Figure 8G:
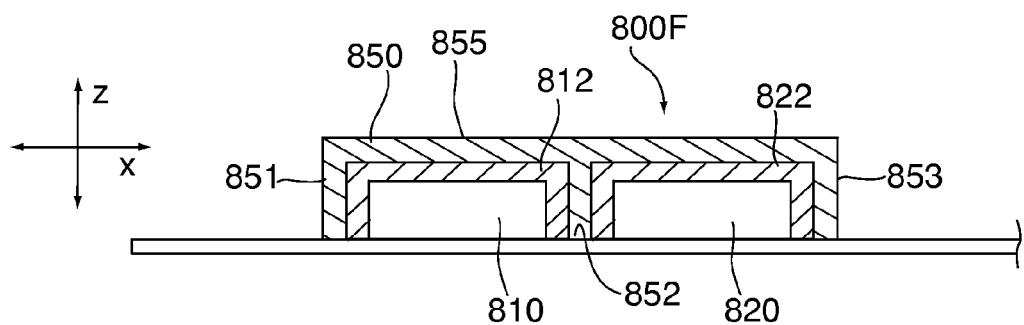
Figure 8H:
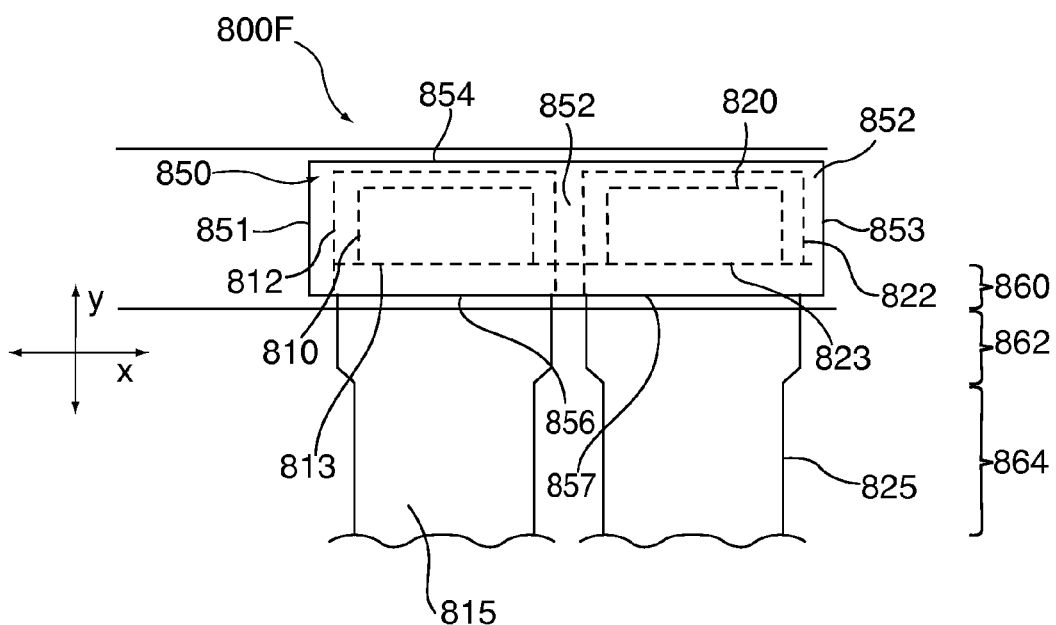

Referring now to FIG. 8F, yet another perspective view of assembly 800F is shown with a conductive shield 850 mounted to a first side of substrate 801 according to an embodiment. A second conductive shield (not shown) can be mounted to the second side of substrate 801. FIG. 8G shows an illustrative cross-sectional of assembly 800F taken along line G-G and FIG. 8H shows an illustrative top view of assembly 800F with conductive shield 850. Conductive shield 850 can be a multi-walled structure constructed to fit over encapsulants 812 and 822, and waveguides 815 and 825. The multi-walled structure can include members 851-855 (854 is not shown) that reflect EHF signals. Members 851, 852, 853, and 854 can form the "legs" of shield 850 and member 855 can form a planar member that sits on top the "legs." Note how member 852 is positioned between EHF CCUs 810 and 820. Member 852 may provide an EHF impenetrable barrier that prevents cross-talk between CCUs 810 and 820. Conductive shield 850 can also include exposed face portions 856 and 857. Exposed face portions 856 and 857 can be an open void to permit non-restrictive EHF signal propagation. The void can permit, for example, a waveguide to abut its associated encapsulant. For example, waveguide 815 may pass though face portion 856 to be mated with encapsulant 812. In some embodiments, the shape and orientation of the exposed face portions may mimic that of the signaling faces. For example, a plane of exposed face 856 may be parallel to a plane of signaling face 813. It should be appreciated that although structure 850 is shown to cover both CCUs 810 and 820, structure 850 can be separated into individual structures suitable for covering only one CCU. It should also be appreciated that structure 850 can be constructed to cover more than two CCUs.

Figure 8I:
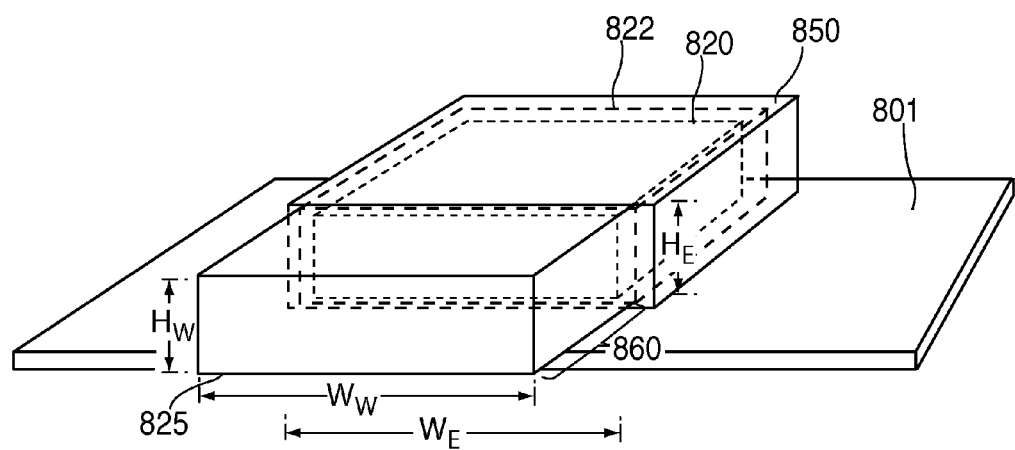

The waveguides shown in FIGS. 8D, 8F, and 8H are all shown to exhibit cross-sectional area variations over their length. For example, the variation may be a product of taper or other variable geometry. Referring specifically to FIG. 8H, waveguide 825 can include interface portion 860, taper portion 862, and cable portion 864. Interface portion 860 can be wider in the X direction than cable portion 864. In addition interface portion 860 can be dimensioned to precisely align with the dimensions of encapsulant 822 to provide the tuned waveguide. FIG. 8I illustrates an enlarged view of a portion of assembly 800 taken from dashed-line circle I of FIG. 8D. FIG. 8I shows that the width ($W_w$) and height ($H_w$) of interface portion 860 is substantially the same as the width ($W_E$) and height ($H_E$) of encapsulant 822.

Variations in waveguide geometry can effectively maximize EHF energy transfer from an EHF CCU to a tuned waveguide. That is, when the waveguide geometry (particularly the interface portion) exceeds the geometry of the EHF CCU, the tuned waveguide may capture more EHF energy than a tuned waveguide that has a smaller geometry than the EHF CCU. The increased size of tuned waveguide geometry need not remain constant throughout the entire length of the waveguide to realize the benefit of enhanced EHF energy capture. As a result, the waveguide can be tapered down to a smaller geometry at some point distal to the interface portion. This advantageously provides design flexibility in waveguide design. For example, the tapering can enable relatively tight bundling of two or more waveguides such as that shown in FIG. 8F and FIG. 9. It should be appreciated that the cross-sectional variance of waveguides is illustrative and not mandatory. Other examples of different waveguides are shown and described below in connection with FIGS. 17A-17E.

Tapering of the waveguides can be achieved using any suitable approach. For example, a waveguide can produced by extruding a material and the taper can be obtained by adjusting any one or more extrusion factors such as extrusion rate or die size. In another example, a waveguide can be subjected to a force pull to cause a portion thereof to neck down. In yet another example, the waveguide can be a molded part (e.g., injection molded) that has the appropriate dimensions and taper.

The waveguides being used in the embodiments described with respect to FIGS. 8A-8I have been described as an independent component that interfaces with an encapsulant, and together with conductive shield 850, they form a tuned waveguide. The waveguides can functionally behave like a cable that can be removably attached to the connector assembly. For example, the waveguide can be a bundled group of waveguides that can be inserted into shield 850 to establish a connection to another device. Similarly, the bundled group of waveguides can be removed when the connection with the other device is no longer required. In other embodiments, the waveguide and encapsulant can be an integrated component that interfaces with the EHF CCU. For example, the integrated waveguide and encapsulant can be mounted to substrate 801 and cover an EHF CCU in the same manner an encapsulant does, and conductive shield 850 can be placed on top of the integrated combination to form the tuned waveguide.

Referring to FIG. 9, an illustrative four channel bundled waveguide 900 is shown. Bundled waveguide 900 includes waveguides 815, 825, 835, and 845. Each waveguide exhibits interface portion 860, taper portion 862, and extension portion 864 as shown. Metal may be incorporated into the bundle in order to maintain signal integrity along the length of each waveguide and eliminate and/or minimize cross-talk among adjacent waveguides. For example, conductive coatings (not shown) may be disposed between adjacent waveguides. For example, the conductive coating can be applied to isolate waveguides 815 and 825 from waveguides 835 and 845, and additional conductive coating can be applied to isolate waveguides 815 and 835 from waveguides 825 and 845. The conductive coating may be disposed contiguously throughout the length of the bundle or the conductive coating can be selectively applied non-contiguously through the length of the bundle. The metal coatings, themselves, may be separated by dielectrics in order minimize cross-talk between the bundled waveguides. If desired, a conductive cladding layer may be disposed around the periphery of bundle 900 to provide EMI shielding. This is illustrated in FIG. 8J.

Bundled waveguide 900 may be an independent component that can be removeably interfaced with a connector assembly, or can it be designed to work with either passive or active cables. Bundled waveguide 900 can be a "passive" component or an "active" component. The passive and active designation may be controlled by whether the waveguide has CCUs incorporated therein. A passive waveguide may functionally operate as a cable for extending the EHF signal pathways of a first connector assembly to a second connector assembly. In a passive waveguide, the interface portion may interface with the signal directing structure of a connector assembly and the distal end of the extension portion may include another interface portion (not shown) that interfaces with another signal directing structure of another connector assembly. An active waveguide may have CCUs incorporated therein. For example, an active waveguide may have a connector assembly that is able to receive EHF signals on each of the EHF signal pathways and convert them into electrical signals for use by another device.

FIG. 8J illustrates a perspective view of assembly 800J having conductive cladding 870 applied to the waveguides in accordance with an embodiment. Assembly 800J may represent a completed connector assembly according to an embodiment. Assembly 800J can be a fully EMI shielded connection system that transmits EHF signals along multiple signal paths.

FIG. 10 shows a perspective view of illustrative connector assembly 1000 according to an embodiment. Assembly 1000 can be similar to assembly 800J, but omits the waveguide. As such, similar components may exhibit similar qualities and characteristics. Assembly 1000 can include substrate 1001, EHF CCU 1010, encapsulant 1012, and conductive shield 1050. Only one CCU is shown, but it is understood that any number of CCUs may be arranged on a first side of substrate 1001 and that any number of CCUs may be arranged on a second side of substrate 1001. In addition, assembly 1000 can include signaling face 1013 and open face portion 1056. The combination of encapsulant 1012 and conductive shield 1050 can form a tuned waveguide (without requiring a separate waveguide) that directs EHF signals along pathway 1020, which is being projected along the Y axis.

FIGS. 11A and 11B show illustrative views of a device and a waveguide cable that can be connected together using connector assemblies according to various embodiments. Device 1110 may be an electronic device such as a phone or laptop and waveguide cable 1150 can be a "passive" cable component. Waveguide 1150 may be "passive" because it does not contain any EHF CCUs. Passive devices may be capable of transmitting EHF signals, but lack EHF CCUs. A standalone waveguide or standalone bundled waveguide is an example of a passive device. Waveguide cable 1150 may include bundled waveguide 1155 that connects waveguide interface 1160 to terminal 1170. Terminal 1170 can be a connector assembly (that includes CCUs such as those described herein), a passive waveguide interface, or another device that includes EHF CCUs. Both device 1110 and cable 1150 may use fully sealed connector interfaces 1120 and 1160, respectively. The fully sealed characteristic may be realized by overmolding the internal components of connector interfaces 1120 and 1160 with a material that completely encompasses them. This can result in a relatively clean-lined, prong-free, housing that is water resistant and potentially waterproof, and that provides a user-friendly connection experience.

Connector assembly 1120 can be based on a connector assembly that does not use waveguides, such as connector assembly 1000 of FIG. 10. Because assembly 1120 is incorporated into the housing device 1110, there may be no need to use one or more separate waveguides to form the tuned waveguide. Alternatively, connector assembly 1120 can be based on a connector assembly similar to connector assembly 800J, but with relatively shortened waveguides. As shown, assembly 1120 may include a 2×2 matrix of pathways 1121-1124 for conducting EHF signals between device 1110 and cable 1150. Connector assembly 1120 may include one or more alignment structures (not shown) to guide or provide keyed insertion with respect to cable 1150.

Cable 1150 can be a bundled waveguide similar to bundled waveguide 900 of FIG. 9. Cable 1150 may include a 2×2 matrix of pathways 1151-1154 for conducting EHF signals between device 1110 and terminal 1170, and these pathways may travel parallel to axis 1162. When cable 1150 is mated with device 1110, pathways 1121-1124 and 1151-1154 are interfaced with each other to provide four interfaced EHF signal pathways. Once interfaced, signals originating from terminal 1170 can be passed through connector interface 1160 to connector assembly 1120. In addition, signals transmitted from connector assembly 1120 are received by interface 1160 transmitted through bundled waveguide 1155 to terminal 1170. Connector interface 1150 may include one or more alignment structures (not shown) to guide or provide keyed insertion with respect to connector assembly 1120 (which may also include alignment structures).

FIGS. 12A and 12B show illustrative top and side views of connector assemblies 1200 and 1250 connected together according to an embodiment. FIGS. 13A-13D show different views of connector assembly 1200. In particular, FIGS. 13A-13D show illustrative top, side, front, and perspective views, respectively of assembly 1200. FIGS. 14A-14G show different views of connector assembly 1250. In particular, FIGS. 14A-14G show illustrative top, side, back, front, bottom, back perspective, and front perspective views of assembly 1250. Reference will be made collectively to FIGS. 12-14 during discussion of assemblies 1200 and 1250.

Connector assembly 1200 may be a passive cable connector that has four waveguides 1201-1204 arranged in a 2×2 matrix as shown. Each waveguide may be nestled within its respective extension member 1211-1214 and may be bundled together to form bundled waveguide 1208. Extension members 1211-1214 may provide an interference fit with corresponding one of receiving members 1261-1264 (of assembly 1250). When connector assemblies 1200 and 1250 are connected together, extension members 1211-1214, together with receiving members 1261-1264, may form a tuned waveguide for each EHF signal path. In addition, the extension and receiving members may form an EMI shield for each EHF signal path.

FIG. 15 shows an illustrative magnet alignment embodiment for first and second devices 1510 and 1520. Device 1510 can include magnet alignment elements 1511 and 1512, and device 1520 can include magnet alignment elements 1521 and 1522. When devices 1510 and 1520 are connected together, elements 1511 and 1521 may connect together, and elements 1512 and 1522 may be connected together. Device 1510 may also include alignment element 1514 and device 1520 may include alignment element 1524. Alignment elements 1514 and 1524 can be designed to interface with each other and provide alternative signaling and/or power transmission between devices 1510 and 1520.

Each device includes a connector assembly that has four EHF CCUs (delineated by the dashed line boxes and are numbered as 1-4). In addition, each EHF CCU includes a re-radiating element (e.g., a slot antenna that is separate and distinct from element 206 or 306). Some of the elements are shown as rectangles orientated according to a polar coordinate (e.g., either 0 degrees or 90 degrees). Re-radiating elements 1 and 3 are both aligned to have a first orientation and elements 2 and 4 are both aligned to have as second orientation. Thus orienting elements in this manner may further eliminate cross-talk among adjacent EHF CCUs. For example, EHF signals emanating from EHF CCU 1 may not be picked up by EHF CCU 2 on the same device because their elements are aligned to different polar coordinates. This matched pair of element orientation may assist any tuned waveguides to further direct EHF signals to travel along a desired signal path. In addition, orienting element in this manner may also reduce cross-talk between diagonally opposite EHF CCUs on 2 different devices. For example, when devices 1510 and 1520 are connected together, like numbered CCU are aligned on top of each other. The orientation of the re-radiating elements may mitigate cross-talk between CCU 1 of device 1510 and CCU 2 of device 1520, and vice versa.

When two connector assemblies are mated together, it may be desirable to provide alignment guidance, retention, and/or mating restrictions. Referring now to FIGS. 16A-16C, several different embodiments that provide alignment guidance, retention, and/or mating restrictions are shown. FIG. 16A shows an illustrative example of connector assemblies using magnets for alignment guidance and retention. As shown, connector assembly 1610 is interfacing with connector assembly 1620. For example, connector assembly 1610 may be associated with a cable device such assembly 800J or connector assembly 1150, and connector assembly 1620 may be associated with a device such as device 1110. Connector assembly 1610 may include mating surface 1612, which may be constructed from a material that exhibits magnetic attraction. Mating surface 1612 may exist around a periphery (e.g., in the shape of a ring) of connector assembly 1610. Connector assembly 1620 may include mating surfaces 1622 and 1624. Surface 1622 may be a magnet with a North polarity and surface 1624 may be a magnet with a South polarity. When assemblies 1610 and 1620 are interfaced with each other, mating surfaces 1612, 1622, and 1624 may attract the connectors together and retain them together.

FIG. 16B shows an illustrative example of connector assemblies using keying elements for mating restriction and magnets for alignment guidance and retention, according to an embodiment. Connector assembly 1630 may include mating surface 1632 and at least one female alignment element 1634 that is incorporated within surface 1632. Female alignment element 1634 may take any shape suitable for accepting a counterpart male alignment element. For example, female alignment element 1634 may be characterized as a cavity, channel, depression, or recess. Connector assembly 1640 may include mating surfaces 1642, 1644, and 1646. One or more of mating surfaces 1642, 1644, and 1646 may be magnetic, but is not necessary. At least one male alignment element 1648 may protrude above the mating surfaces. Male alignment element 1648 may be designed to fit into female alignment element 1634. Male alignment element 1648 can be characterized as a protrusion, ridge, raised member, or other suitable structure. In some embodiments, element 1648 can be a power node or a magnet.

The use of alignment elements 1634 and 1648 may provide a keying mechanism that limits the orientation of how connector assemblies 1630 and 1640 interface with each other. As shown, assembly 1630 can only interface with assembly 1640 in one orientation. Referring now to FIG. 16C, different keying elements may be utilized in situations where it is desirable to have connector assemblies that have selective or universal interfacing capabilities with one or more different types of counterpart connector assemblies. For ease of discussion, connector assemblies can be classified as insertion connectors and reception connectors. Insertion connectors can include male alignment members, which may sometimes be referred to as protrusions. Reception connectors can include female alignment members, which may sometimes be referred to as grooves. If desired, the insertion and reception connectors may include a mix of male and female alignment members. As shown, there are three different insertion connectors, labeled as 1650, 1651, and 1652 and there are three different reception connectors, labeled as 1653, 1654, and 1655. The protrusion and groove arrangement of each connector is self-explanatory and illustrative. Insertion connector assembly 1650 may interface with reception connector assemblies 1653 and 1655, but not 1654. Insertion connector assembly 1651 may interface with reception connector assemblies 1654 and 1655, but not 1653. Insertion connector assembly 1652 may interface only with reception connector assembly 1655.

Different connector keying configurations may be designated for specific or universal connector functionality. For example, it may be desirable for a connector to have only one function, such as a USB connector, or it may be desirable for a connector to provide universal support of two or more different functions (e.g., USB and Display Port). As a specific example, connector assemblies 1650 and 1653 may be configured to support a first function (e.g., a USB connector). Connector assembly 1652 may be configured to support a second function (e.g., Display Port). Connector assemblies 1651, 1654, and 1655 may be configured to support multiple functions (e.g., USB and Display Port).

FIGS. 17A-17E show several different surface textures of various connector assemblies and waveguide cables according to various embodiments. These surface texture variations provide just a few of many different possibilities made possible using embodiments described herein. It should be appreciated that although the discussion of FIGS. 17A-17E may not make specific reference to signal directing structures, CCUs, alignment elements, or other features discussed herein, any combination of such features can be used. Some of the surface textures may be cosmetic and others may be functional, and some may be a combination of both. For example, a functional purpose of the textures and/or shapes may be to increase connection density to enable higher EHF energy throughput.

Figure 17A:
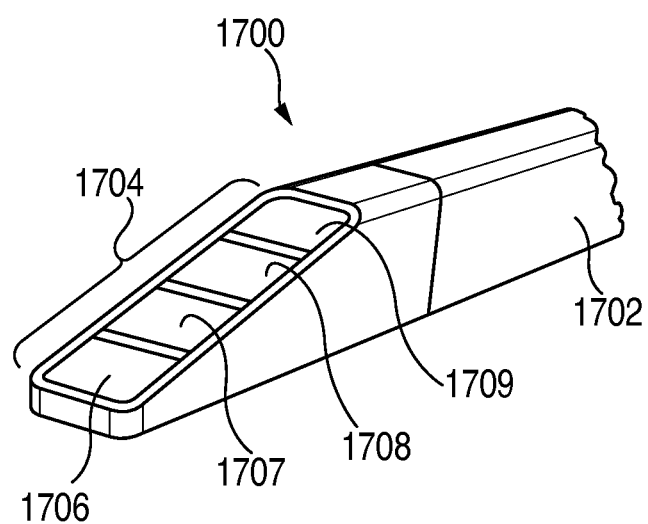

FIG. 17A illustrates a wedge shaped connector assembly 1700. Assembly 1700 may include a bundled waveguide 1702 of two or more individual waveguides. Each of the individual waveguides may terminate at interface 1704. Interface 1704 may exhibit a slanted or wedge shape. This can result in signaling faces 1706-1709 of each individual waveguide having a relatively larger surface area (which may improve energy transfer of EHF signal along their respective EHF signal pathways) relative to a connector interface that has a blocked or squared off shape.

Figure 17B:
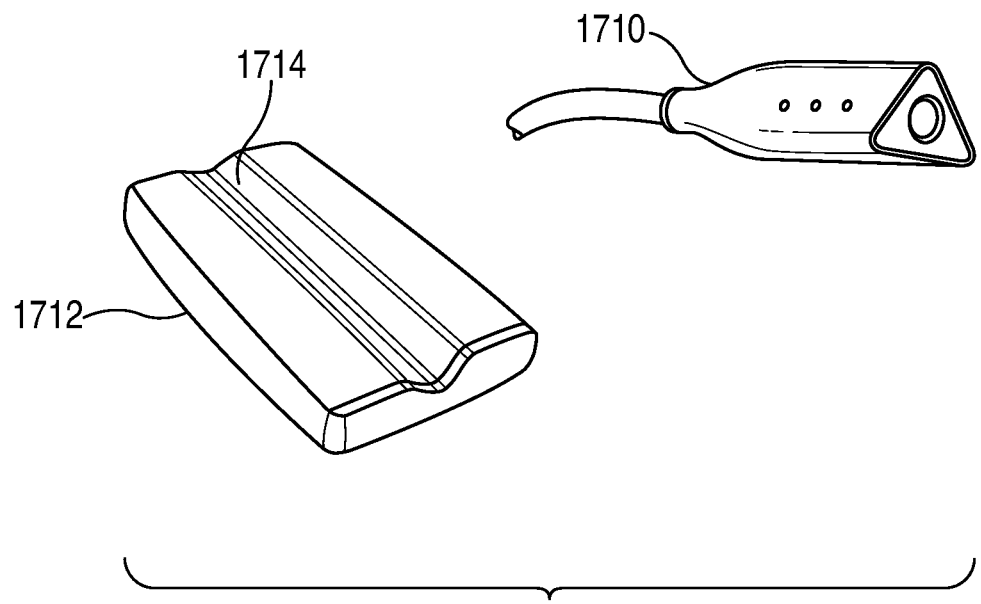
Figure 17C:
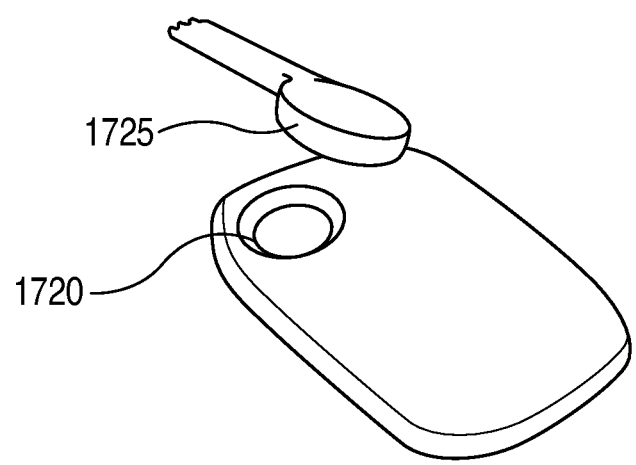
Figure 17D:
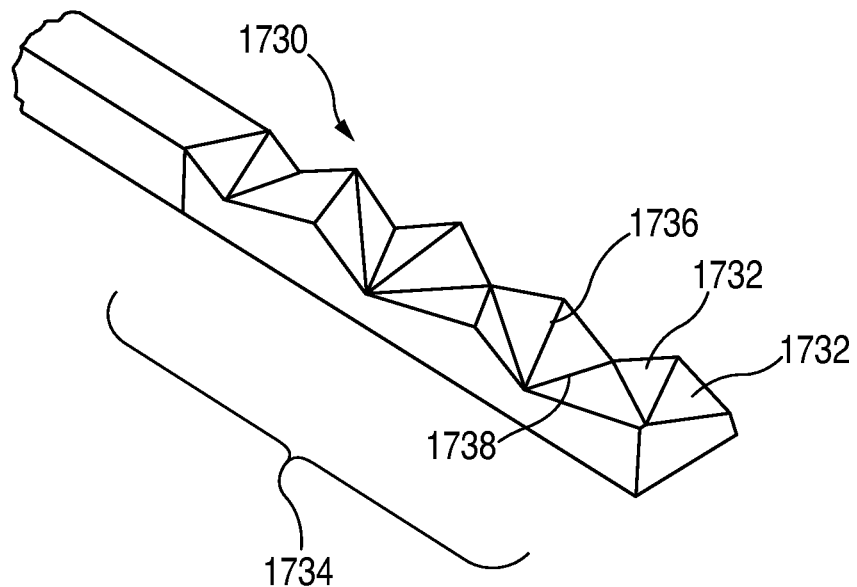
Figure 17E:
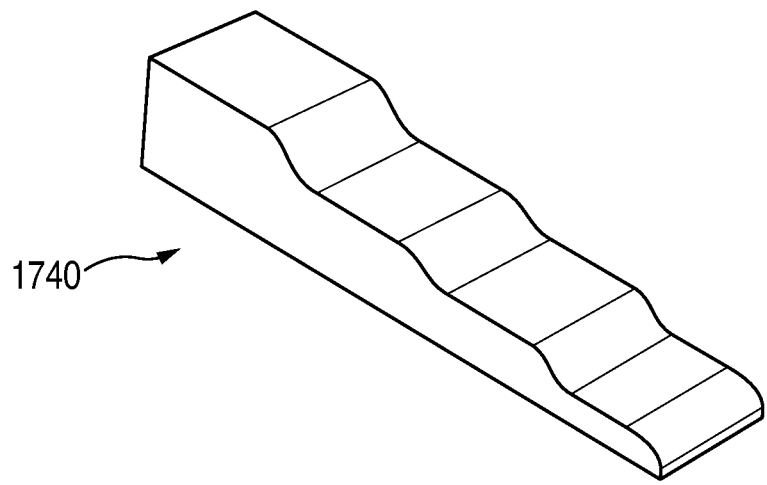

FIG. 17B illustrates a polygonal column shaped connector assemblies 1710 and 1712. Assembly 1710 may fit within polygonal trough interface 1714 of assembly 1712. FIG. 17C illustrates a sunken cavity shaped connector assembly 1720 that is operative to receive plug shaped connector assembly 1725 that fits the contours of assembly 1720. In some embodiments, the sunken cavity can be through-hole, or it may be a cavity of a fixed depth. FIG. 17D illustrates a tessellated connector assembly 1730 according to an embodiment. Assembly 1730 may include several connector faces 1732 that form interface 1734. Connector faces 1732 may include a series of terraced forms that result in an undulating surface texture. This undulating surface texture may increase connection density, which may, for example, enable an EHF CCU to be placed on or below each surface. In one embodiment, connector faces 1732 may form several crests 1736 and troughs 1738. FIG. 17E illustrates a step-shaped connector interface 1740. As shown, interface 1740 may contain several steps, each one pertaining to a waveguide or signal directing structure.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

Whereas many alterations and modifications of the present invention will no doubt become apparent to a person of ordinary skill in the art after having read the foregoing description, it is to be understood that the particular embodiments shown and described by way of illustration are in no way intended to be considered limiting. Therefore, reference to the details of the preferred embodiments is not intended to limit their scope.

What is claimed is:

1. A contactless connector assembly, comprising:
   a connector interface housing comprising:
      a plurality of extremely high frequency (EHF) contactless communication units (CCUs) operable to selectively transmit and receive EHF signals; and
      a plurality of signal directing structures coupled to the EHF CCUs, wherein the signal directing structures direct the EHF signals along a plurality of EHF signal pathways, wherein the EHF CCUs are arranged in a multi-row, multi-column array within the connector interface housing, and wherein the signal directing structures mitigate cross-talk among adjacent EHF CCUs even though spacing of the EHF CCUs within the array is such that but for the signal directing structures, undirected EHF energy emanating from any one of the EHF CCUs would overlap undirected EHF energy emanating from another EHF CCU.

2. The contactless connector assembly of claim 1, further comprising:
   a plurality of waveguides that are releasably coupled to the signal directing structures within the connector interface housing.

3. The contactless connector assembly of claim 2, wherein the waveguides extend a fixed distance away from a periphery of the connector interface housing and wherein the waveguides extends at least one of the EFH signal pathways to that fixed distance.

4. The contactless connector assembly of claim 2, wherein each of the waveguides directly interfaces with one of the signal directing structures.

5. The contactless connector assembly of claim 2, wherein each of the signal directing structures comprises a signaling face that defines a focal axis of one of the EHF signal pathways, and wherein each of the waveguides comprises a focal axis.

6. The contactless connector assembly of claim 5, wherein the focal axes of the signal directing structures and the waveguides are co-axially aligned.

7. The contactless connector assembly of claim 1, wherein the connector interface housing comprises at least one alignment structure.

8. The contactless connector assembly of claim 7, wherein the at least one alignment structures comprises a keying element.

9. The contactless connector assembly of claim 2, wherein the plurality of waveguides are bundled to form a bundled waveguide, wherein a cross-sectional area of the bundled waveguide is less than a cross-sectional area of the connector interface housing.

10. The contactless connector assembly of claim 2, wherein a distal end of the plurality of waveguides is coupled to a terminal.

11. The contactless connector assembly of claim 2, wherein each waveguide comprises:
    an interface portion that interfaces with one of the signal directing structures;
    an extension portion; and
    a taper portion that exists between the interface portion and the extension portion.

12. The contactless connector assembly of claim 11, wherein the interface portion has a larger cross-section than a cross-section of the cable portion.

13. The contactless connector assembly of claim 1, wherein each one of the signal directing structures comprises an encapsulant that focuses direction of the EHF signal along one of the pathways.

14. The contactless connector assembly of claim 1, wherein each one of the signal directing structures comprises:
    an encapsulant that covers at least a portion of one of the EHF CCUs; and
    a conductive structure that covers at least a portion of the encapsulant.

15. The contactless connector assembly of claim 1, wherein the connector interface housing is characterized by a shape selected from the group consisting of a wedge, a polygon, and tessellations.

16. The contactless connector assembly of claim 1, wherein each one of the signal directing structure comprises:
    an encapsulant; and
    a waveguide that is secured to the encapsulant.

17. A contactless connector assembly, comprising:
    a connector interface housing comprising:
       a plurality of extremely high frequency (EHF) contactless communication units (CCUs) operable to selectively transmit and receive EHF signals;
       a plurality of signal directing structures coupled to the EHF CCUs, wherein the signal directing structures direct the EHF signals along a plurality of EHF signal pathways; and
       a plurality of waveguides that are releasably coupled to the signal directing structures within the connector interface housing, wherein each waveguide comprises:
          an interface portion that interfaces with one of the signal directing structures;
          an extension portion; and
          a taper portion that exists between the interface portion and the extension portion, wherein the taper portion is derived from one of a variable extrusion rate of the waveguide and a force pull of the waveguide.

18. A contactless connector assembly, comprising:
    a substrate including a first surface and a first axis;
    a plurality of EHF contactless communication units (CCUs) mounted to the first surface of the substrate and along the first axis, wherein each EHF CCU selectively transmits and receives EHF signals; and
    a signal directing structure coupled to the plurality of EHF CCUs, the signal directing structure comprising:
       a plurality of signal shaping encapsulants each constructed to at least partially cover one of the EHF CCUs and direct EHF signals associated with that one EHF CCU along a EHF signal pathway, wherein the plurality of signal shaping encapsulants mitigate cross-talk among adjacent EHF CCUs even though spacing of the EHF CCUs on the substrate is such that but for the plurality of signal shaping encapsulants, undirected EHF energy emanating from any one of the EHF CCUs would overlap undirected EHF energy emanating from another EHF CCU.

19. The contactless connector assembly of claim 18, further comprising:
    a housing that encompasses the substrate, the EHF CCUs, and the signal directing structure.

20. The contactless connector assembly of claim 19, further comprising a plurality of conductive cables each electrically coupled to the substrate and to a terminal.

21. The contactless connector assembly of claim 20, wherein the terminal is a connector designed to transmit data according to a Standard-based protocol for communicating electrical signals over a physical link.

22. The contactless connector assembly of claim 21, wherein the Standards-based protocol is selected from the group consisting of USB, DisplayPort, PCIe, SATA, SAS, MHI, HDMI, Ethernet, Thunderbolt, Quickpath, D-PHY, M-PHY, DVI, and Hypertransport.

23. The contactless connector assembly of claim 18, further comprising:
a shielding member positioned between adjacent EHF CCUs, wherein the signal directing member at least partially encapsulates the shielding member.

24. The contactless connector assembly of claim 18, wherein each of the encapsulants is constructed to direct EHF signals in a direction perpendicular to the first surface.

25. A contactless connector assembly, comprising:
a substrate including first and second surfaces and a first axis;
a first plurality of EHF contactless communication units (CCUs) mounted to the first surface of the substrate and along the first axis, wherein each EHF CCU selectively transmits and receives EHF signals;
a second plurality of EHF contactless communication units (CCUs) mounted to the second surface of the substrate and along the first axis, wherein each EHF CCU selectively transmits and receives EHF signals;
at least a first signal directing structure coupled to the first plurality of EHF CCUs; and
at least a second signal directing structure coupled to the second plurality of EHF CCUs, wherein the at least the first and second of signal directing structures mitigate cross-talk among adjacent EHF CCUs even though spacing of the EHF CCUs mounted on the first and second surfaces is such that but for the signal directing structures, undirected EHF energy emanating from any one of the EHF CCUs would overlap undirected EHF energy emanating from another EHF CCU;
wherein the at least the first and second signal directing structures direct the EHF signals associated with each EHF CCU along a EHF signal pathway.

26. The contactless connector assembly of claim 25, wherein the EHF signal pathway is oriented to a plane parallel to the first surface and in a direction orthogonal to a third surface of the substrate, wherein the third surface is perpendicular to the first and second surfaces.

27. The contactless connector assembly of claim 25, wherein each of the at least first and second signal directing structures comprises:
an encapsulant; and
a conductive shield.

28. The contactless connector assembly of claim 25, wherein the first and second signal directing structures are each constructed to receive at least one waveguide.

29. The contactless connector assembly of claim 28, wherein each waveguide comprises:
an interface portion constructed to abut one of the signal directing structures;
an extension portion; and
a taper portion that exists between the interface portion and the extension portion.

30. The contactless connector assembly of claim 29, wherein the taper portion is derived from one of a variable extrusion rate of the waveguide and a force pull of the waveguide.

31. The contactless connector assembly of claim 29, wherein the interface portion has a larger cross-section than a cross-section of the cable portion.

* * * * *

UNITED STATES PATENT AND TRADEMARK OFFICE
CERTIFICATE OF CORRECTION

PATENT NO. : 9,571,161 B2
APPLICATION NO. : 14/459021
DATED : February 14, 2017
INVENTOR(S) : Almgren et al.

It is certified that error appears in the above-identified patent and that said Letters Patent is hereby corrected as shown below:

On the Title Page

Column 1, item (60), Line 2, delete "3," and insert -- 13, --, therefor.

Column 2, item (56), under "U.S. PATENT DOCUMENTS", Entry 6, delete "385/30" and insert -- G02F 1/2255 385/30 --, therefor.

In the Drawings

On Sheet 1 of 25, Figure 1, Box "112", delete "COMUNICATIONS" and insert -- COMMUNICATIONS --, therefor.

On Sheet 1 of 25, Figure 1, Box "122", delete "COMUNICATIONS" and insert -- COMMUNICATIONS --, therefor.

In the Claims

In Column 17, Line 67, Claim 12, delete "cable" and insert -- extension --, therefor.

In Column 20, Line 34, Claim 31, delete "cable" and insert -- extension --, therefor.

Signed and Sealed this
Twenty-eighth Day of July, 2020

Andrei Iancu
*Director of the United States Patent and Trademark Office*